United States Patent
Moslehi et al.

[11] Patent Number: 5,082,542
[45] Date of Patent: Jan. 21, 1992

[54] DISTRIBUTED-ARRAY MAGNETRON-PLASMA PROCESSING MODULE AND METHOD

[75] Inventors: Mehrdad M. Moslehi, Dallas; Cecil J. Davis, Greenville, both of Tex.

[73] Assignee: Texas Instruments Incorporated, Dallas, Tex.

[21] Appl. No.: 561,851

[22] Filed: Aug. 2, 1990

[51] Int. Cl.$^5$ .................... H01H 1/46; B01J 19/12
[52] U.S. Cl. .................... 204/192.32; 204/298.16; 204/298.19; 204/298.37; 118/723; 156/345; 156/643; 315/111.41; 315/111.71
[58] Field of Search .............. 204/192.32, 298.16, 204/298.19, 298.37; 156/345, 643; 118/723; 313/153–154; 315/111.41, 111.51, 111.71

[56] References Cited
U.S. PATENT DOCUMENTS

| | | | |
|---|---|---|---|
| 4,631,106 | 12/1986 | Nakazato et al. | 156/345 |
| 4,632,719 | 12/1986 | Chow et al. | 156/345 |
| 4,740,268 | 4/1988 | Bukhman | 156/643 |

FOREIGN PATENT DOCUMENTS 62-147733  7/1987  Japan .................... 156/345

*Primary Examiner*—Aaron Weisstuch
*Attorney, Agent, or Firm*—James C. Kesterson; James T. Comfort; Richard L. Donaldson

[57] ABSTRACT

A semiconductor wafer plasma processing magnetron module (12) for magnetron-plasma-enhanced processing of semiconductor wafers comprises a base (50) and distributed magnet array (52). The magnet array (52) comprises a plurality of associated magnet unit cells (54). Unit cells (54) associated for producing a periodic magnetic field at the semiconductor wafer (22). The magnetron (12), including the magnetic array (52), mounts to base (50). Unit cells (54) form a repetitive pattern across the surface of magnet array (52). Magnetron module (12) produces a magnetic field possessing periodic uniformity. Unit cells (54) associate to permit expansion of magnet array (52) for any wafer size. A preferred embodiment of the invention includes a hexagonal configuration of magnets (56) and (58) that form unit cells (54).

60 Claims, 18 Drawing Sheets

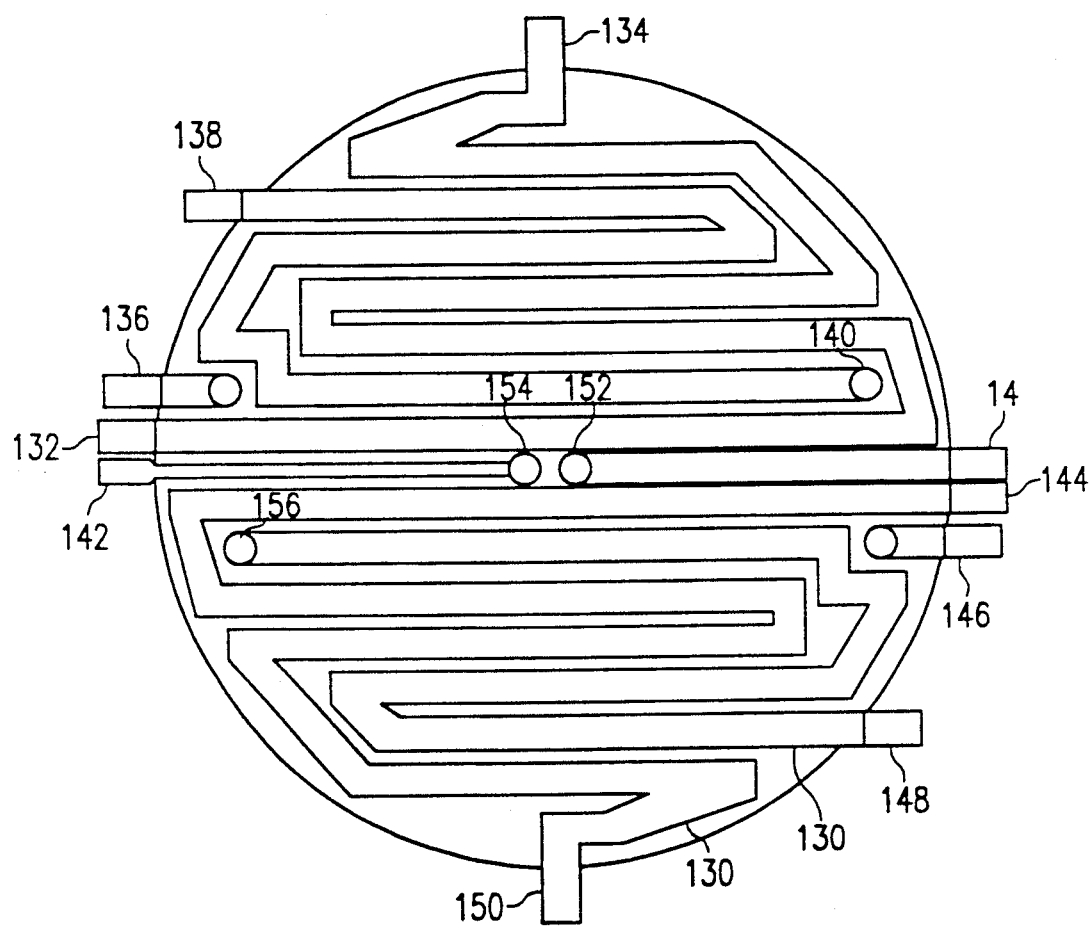

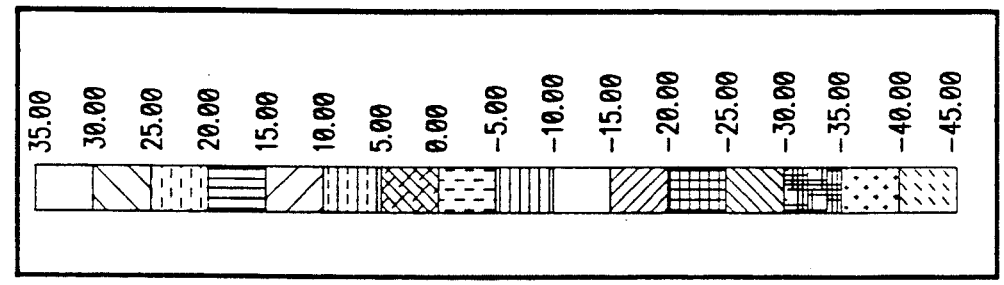
FIG. 19
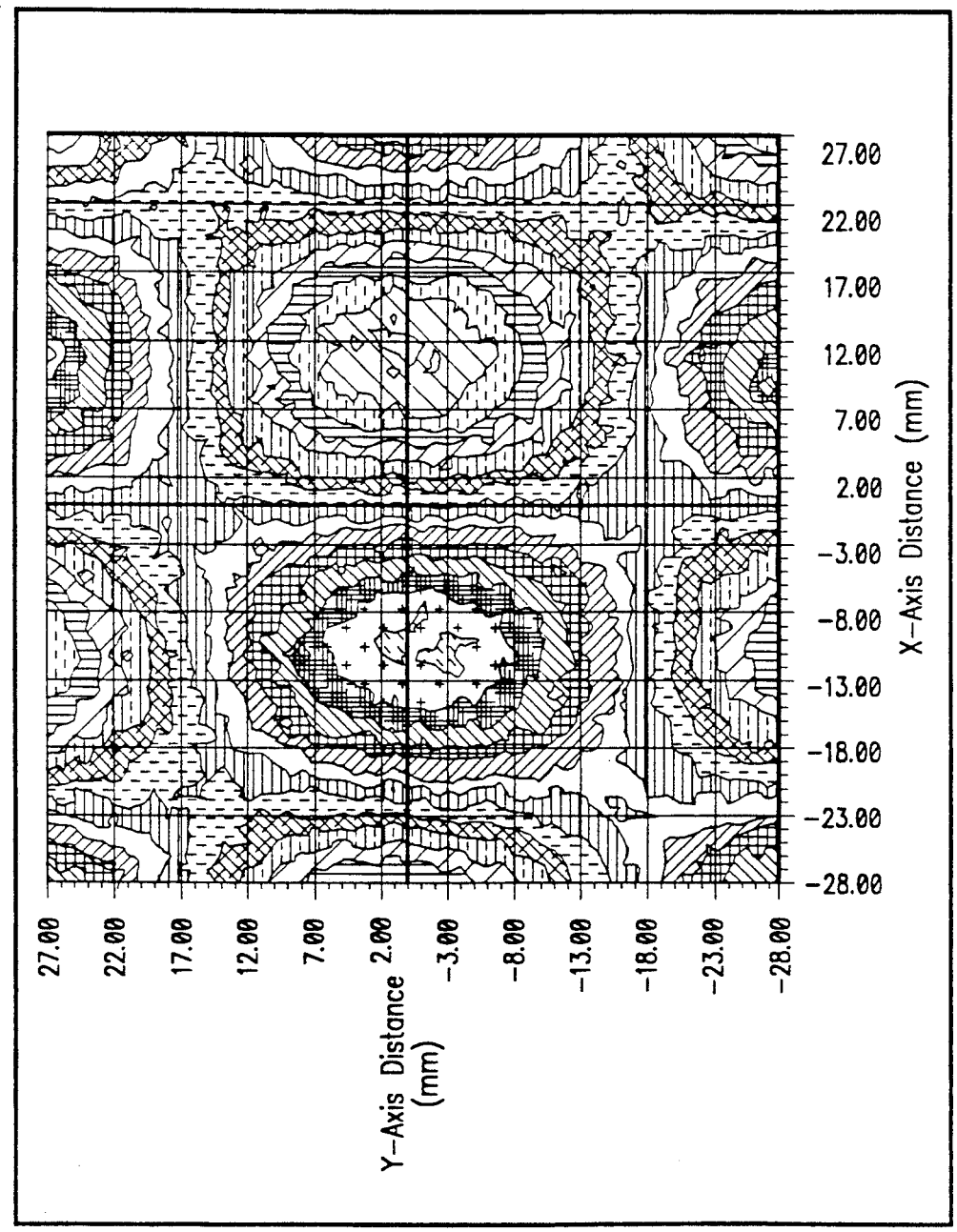

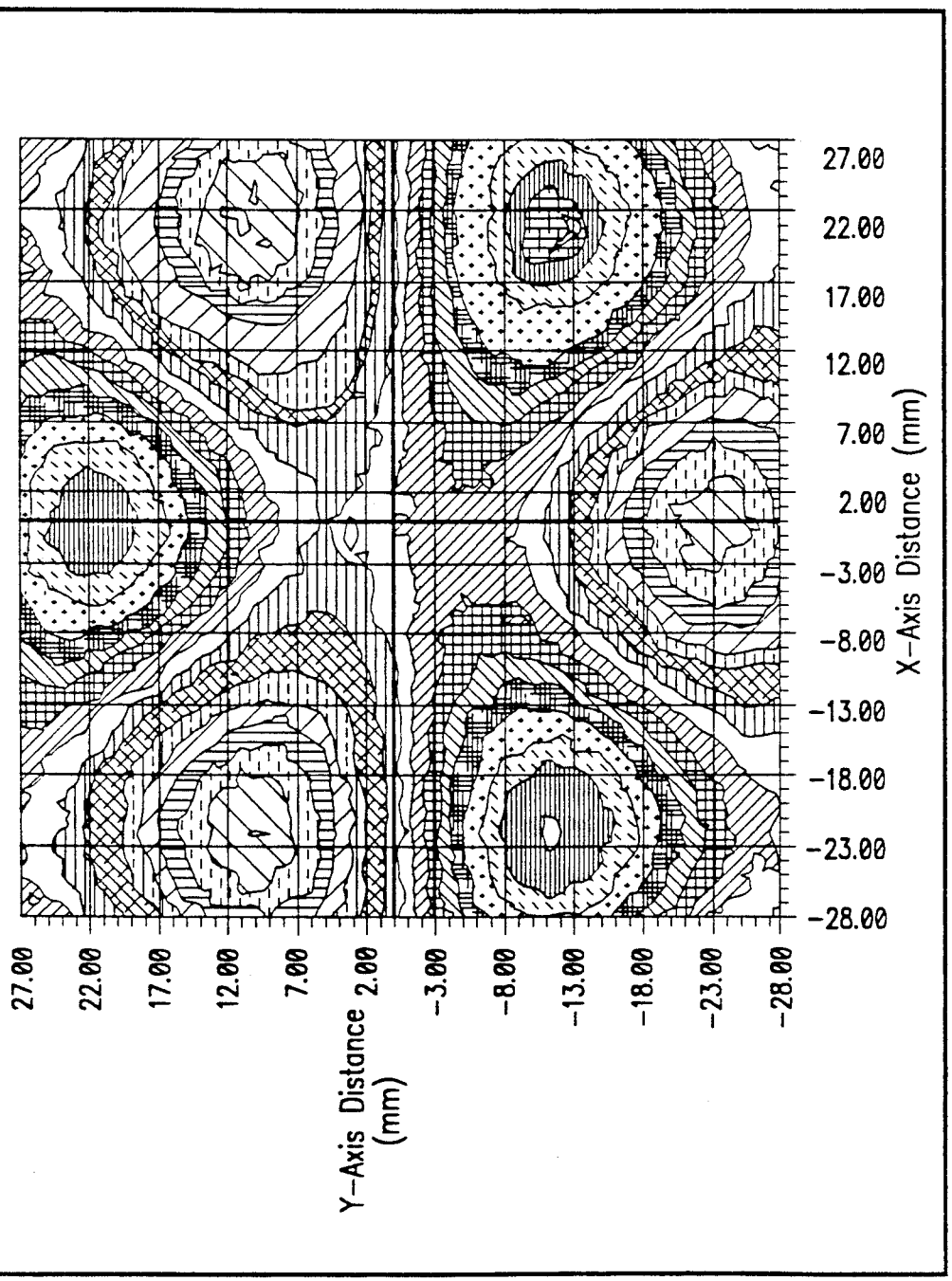

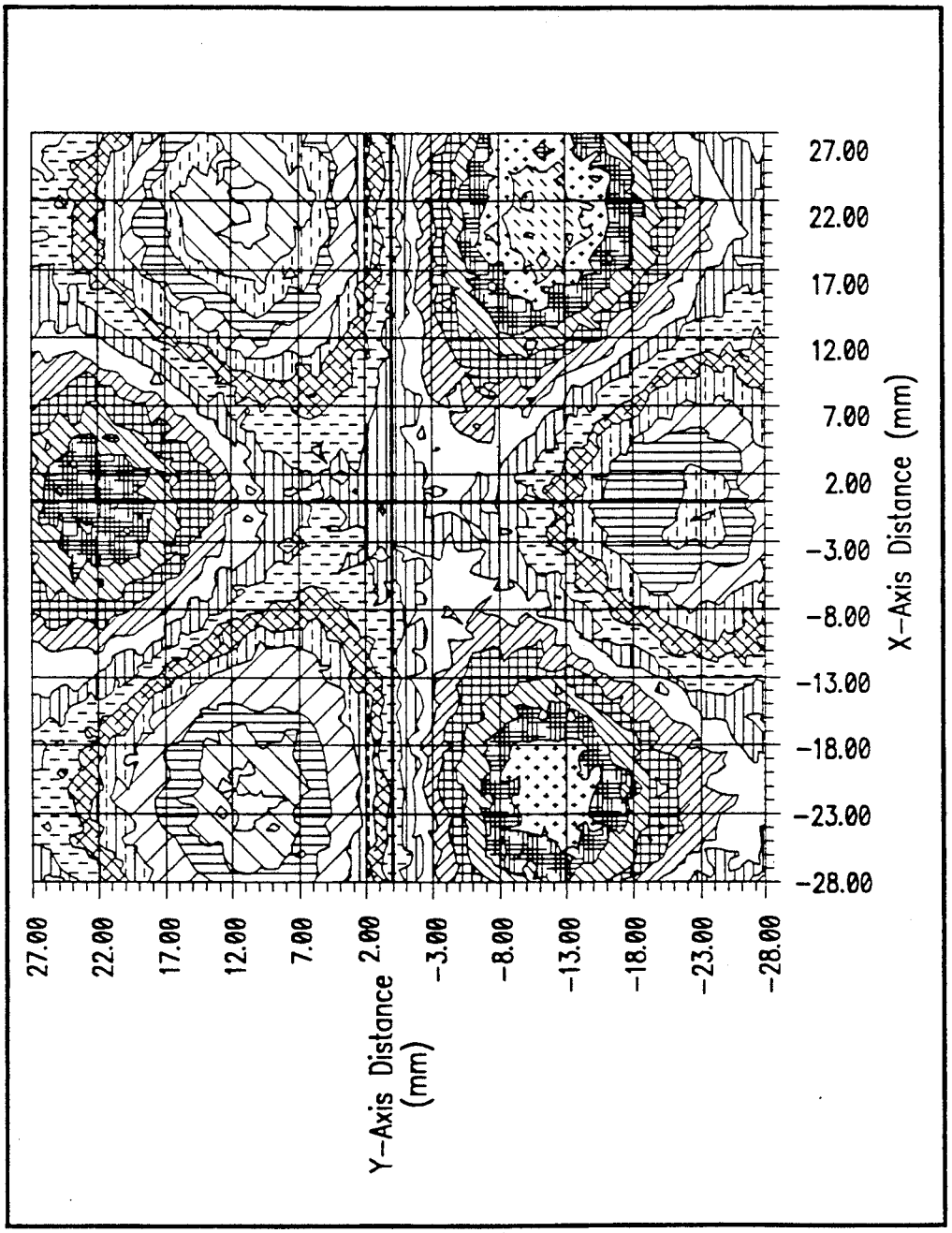

DISTRIBUTED-ARRAY MAGNETRON-PLASMA PROCESSING MODULE AND METHOD

TECHNICAL FIELD OF THE INVENTION

The present invention relates in general to semiconductor device manufacturing, and more particularly to a distributed-array magnetron-plasma processing module for magnetron-plasma-enhanced deposition, etching, cleaning, and annealing processes on semiconductor wafers.

BACKGROUND OF THE INVENTION

Manufacturers of electronic components use a variety of processing techniques to fabricate semiconductor devices. One technique that has many applications (e.g. deposition, etching, cleaning, annealing) is known as "plasma-assisted" processing which is a dry processing technique. In plasma-assisted processing, a substantially ionized gas, usually produced by high-frequency electrical discharge, generates activated metastable neutral and ionic species that chemically react to deposit thin material layers or to etch materials on semiconductor substrates in a processing reactor.

Various applications for plasma-assisted processing in semiconductor device manufacturing may include high-rate reactive-ion etching (REI) of thin films of polysilicon, metals, oxides, and polyimides; dry development of exposed and silylated photoresist layers; plasma-enhanced chemical-vapor deposition (PECVD) of dielectrics, aluminum, copper, and other materials; low-temperature dielectric chemical-vapor deposition for materials such as boron nitride and silicon nitride; planarized interlevel dielectric formation, including procedures such as bias sputtering; and low-temperature epitaxial semiconductor growth processes.

Reactive ion etching (RIE), an example of low-pressure plasma-assisted processes, uses the directional and energetic ions in the plasma to selectively etch materials on a semiconductor substrate that is directly proximate to the plasma environment. RIE processes can take place in the conventional parallel-plate radio-frequency (RF) powered plasma processing reactors or similar semiconductor device fabrication equipment. In RIE, a high-power (100–1000 W) radio-frequency (RF) electrical power source interacts with process gases to produce a plasma that can interact with the semiconductor wafer. The frequency of the RF power source is usually in the range of 100 KHz–30 MHz (mostly 13.56 MHz).

In conventional plasma processes such as RIE, there is a trade-off between processing rate or throughput and the semiconductor device quality. To enhance the RIE processing rate, the plasma density and ion flux should be increased. According to conventional plasma processing methods, increasing the RF power that produces the plasma via electromagnetic gas discharge increases ion density. Increasing the RF power to the plasma medium, however, also raises the average plasma ion energy levels, and ions with excessive directional energies (e.g. several hundred electron volts) may damage the semiconductor devices. This is because the ions are so energetic that upon impact they penetrate and cause irradiation damage to the semiconductor device surface. When this type of ion-induced radiation damage occurs, a post-fabrication cleansing or annealing process is necessary to minimize the adverse effects to semiconductor device performance. Moreover, many anisotropic plasma etch processes based on RIE usually leave undesirable chemical deposits such as fluorohydrocarbons on the semiconductor wafer surface, resulting in manufacturing yield degradation. Ultimately, the manufacturer must remove these deposits from the semiconductor surface by some post-etch cleaning. In conventional plasma processing techniques, the plasma medium can interact with the plasma chamber walls, resulting in deposition of various contaminants (such as metals) onto the semiconductor wafer (contaminants are sputter etched from the plasma electrodes and reactor walls).

The combined effects of irradiation damage, formation of fluoro-carbon films, plasma-induced contaminants, and other undesirable phenomena produce semiconductor devices with less than optimal performance characteristics and limit device fabrication process yield. Thus, with conventional plasma-assisted processing techniques, increasing RF power to increase ion density with the intent to raise the process rate can have serious detrimental effects. If a method existed, however, to increase the plasma density and ion flux without also increasing ion energies, then a manufacturer may increase plasma-assisted processing rates without device yield degradation.

Therefore, a need exists for a method and apparatus to increase ion density near a semiconductor device during plasma-assisted processing without at the same time increasing the average ion energy levels.

As mentioned earlier, another limitation of conventional plasma-assisted processes derives from the fact that, during these processes, plasma disperses throughout the fabrication process chamber. In so doing, it interacts with the process chamber walls. These walls contain various metals that the plasma species can remove via sputter etch or chemical reactions, transport to the semiconductor device surface, and embed into the semiconductor device. As a result, further semiconductor device degradation occurs.

Consequently, there is a need for a method and apparatus to prevent plasma interaction with fabrication reactor process chamber walls during plasma-assisted processing.

To remedy the above problems in plasma-assisted processing, manufacturers often use techniques known as "magnetron-plasma-enhanced" (MPE) processing. MPE processing basically entails applying a predetermined magnetic field in the proximity of the semiconductor wafer during the plasma-assisted process. During an MPE process, the magnetic field confines the plasma and causes the plasma to appear as a gaseous ball enveloping the semiconductor wafer and centered therewith. As a result, the plasma ion density is greatest near the semiconductor wafer, and the plasma that the semiconductor substrate sees does not interact significantly with the process chamber walls. This plasma magnetization and confinement provides improved gas excitation and higher plasma density than with conventional plasma processing techniques. MPE processing raises the device processing rate, increases equipment throughput, and reduces semiconductor device degradation from process chamber wall contaminants by making the plasma concentrate near the semiconductor substrate. Thus, MPE processing can produce higher semiconductor device processing rates without an increase in local plasma ion energies and without ion-induced irradiation damage.

Conventional MPE apparatus designs employ two permanent magnet bars of opposite polarities positioned near the semiconductor wafer in the fabrication reactor. These permanent magnets produce a magnetic field near the semiconductor device surface which has both transverse and longitudinal magnetic flux components. The magnitudes of these magnetic field components may vary significantly over the wafer surface. These magnetic field non-uniformities cause plasma ion density non-uniformities over the semiconductor device. Consequently, a semiconductor device layer deposition or etching resulting from these conventional MPE processes will also suffer from non-uniformities. Moreover, the conventional magnetron plasma modules do not provide any capability for magnetic field uniformity adjustment. As a result, process uniformity optimizations are performed by adjusting other process parameters such as RF power and process pressure. Complete uniformity optimization via other process parameters (e.g., RF power) is often impossible or very difficult.

The transverse and longitudinal magnetic flux components from conventional magnetron plasma modules in a typical cylindrical processing chamber can produce both radial and tangential process non-uniformities. By rotating the conventional MPE magnetron in the horizontal plane, a conventional MPE magnetron may produce a more uniform magnetron plasma process with some cylindrical symmetry. Rotating conventional MPE magnetrons in this manner requires a more complex fabrication reactor, because the magnetron module components are usually embedded within the RF plasma chuck against which the semiconductor wafer is clamped.

Thus, there is a need for a method and apparatus that provides a suitable magnetic field distribution for MPE processing of semiconductor wafers of various sizes (e.g. 6"-10" in diameter) without the process non-uniformity problems of conventional magnetron plasma modules.

While conventional magnetron plasma modules may be able to produce a somewhat uniform transverse magnetic field because of the magnetic flux field shape they produce, they cannot usually produce a uniform MPE etch or deposition process. Moreover, the conventional magnetron plasma modules are not usually easily scalable for larger wafer processing. To overcome the limitations of the conventional MPE processing magnetrons, one approach is to adjust the RF power extracted from the RF source. This adjustment, however, can adversely affect other parameters associated with RF power. This is because, as already stated, varying the RF power affects the plasma ion energy levels as well as the plasma density.

As a result, there is a need for a magnetron plasma processing module for producing a suitable magnetic field distribution for uniform MPE processing of semiconductor wafers of various sizes.

SUMMARY OF THE INVENTION

According to one aspect of the present invention, there is provided a semiconductor wafer plasma processing magnetron module for plasma-assisted processing of a semiconductor wafer that properly disperses magnetic field sources to generate a distributed magnetic field across the semiconductor substrate. The module comprises a distributed magnet array associated to produce a suitable transverse magnetic field at the semiconductor substrate. The magnet array, in one embodiment, comprises a plurality of equally distributed unit cells that comprise a plurality of magnets mounted to a common base with their poles in two parallel planes, with the magnet poles in each plane having reverse polarity from the poles in the other plane.

Another aspect of the present invention includes a semiconductor wafer plasma processing magnetron module for plasma-assisted processing of a semiconductor substrate. The magnetron assembly comprises a magnetically conductive base plate and a distributed magnetic array mounted to the base. The magnet array comprises a plurality of unit cells forming a uniformly repetitive pattern across the magnet array within a specifically defined perimeter of periodic magnetic field distribution. The unit cells comprise a plurality of associated magnets and adjoin one another to form a periodic magnetic field at the semiconductor wafer surface. The magnet array produces a magnetic field possessing proper distribution for cylindrical and radial uniformity of the plasma etch or distribution process. In the present invention, the unit cells associate to permit expansion of the magnet array by further addition of a plurality of the unit cells. A preferred embodiment of the invention includes a magnet array that comprises a plurality of unit cells, each of which comprises a hexagonal arrangement or configuration of magnets.

A technical advantage of the invention is that it overcomes certain major limitations of known plasma-assisted processing apparatuses and methods. The magnetron modules of the present invention provide a greater plasma ion density in the proximity of the semiconductor wafer within the plasma fabrication reactor while at the same time preventing excessive ion energies. Additionally, the present invention can provide for radial and cylindrical uniformity of the magnetic field, thereby assuring uniform plasma ion density near the semiconductor wafer. MPE processing using the present invention offers high-throughput and damage-free deposition and etching processes (as well as other applications such as surface cleaning and plasma annealing).

Yet another technical advantage of the present invention is that it fully avoids large-scale semiconductor wafer process non-uniformities as processing reactors and semiconductor wafers increase in size. The magnetron modules of this invention are easily scalable for use in plasma processing equipment for larger wafer diameters (e.g. 6", 8", 10", . . . ).

Another technical advantage of the present invention is that there is no essential need for large-scale scanning motion in order to provide a uniform MPE processing.

The present invention has a wide variety of applications. Plasma-assisted processes that the present invention can improve include high-rate reactive-ion etching of polysilicon, aluminum, oxides, tungsten, copper, and polyimides; plasma-enhanced chemical-vapor deposition (PECVD) of dielectrics, aluminum, and other materials; low-temperature metal-organic chemical-vapor deposition (MOCVD) of metals including aluminum; low-temperature dielectric chemical-vapor deposition for materials such as nitrides and oxides; planarized interlevel dielectric formation, including procedures such as bias sputtering; and low-temperature epitaxial semiconductor growth. Other applications will become apparent as manufacturers use the present invention.

BRIEF DESCRIPTION OF THE DRAWINGS

The invention, as well as modes of use and further advantages, is best understood by reference to the following description of illustrative embodiments when read in conjunction with the accompanying drawings.

FIG. 11 shows a planar view of a preferred embodiment of the multipurpose chuck stainless steel support base vacuum plate (bottom section);

FIG. 19 provides a contour plot of the magnetic flux density for a hexagonal-array magnetron module of the present invention (transverse "x" component of the magnetic field at a plane which is 20 mm away from the plane of magnet poles);

FIG. 21 is a contour plot of the magnetic flux density for a hexagonal-array magnetron module of the present invention (transverse "y" component of the magnetic field at a plane which is 15 mm away from the plane of magnet poles); and FIG. 22 shows a contour plot of the magnetic flux density for a hexagonal-array magnetron module of the present invention (transverse "y" component of the magnetic field at a plane which is 20 mm away from the plane of the magnet poles).

DETAILED DESCRIPTION OF THE INVENTION

The preferred embodiment of the present invention is best understood by referring to FIGS. 1-21, like numerals being used for like and corresponding parts of the various drawings.

Figure 1:
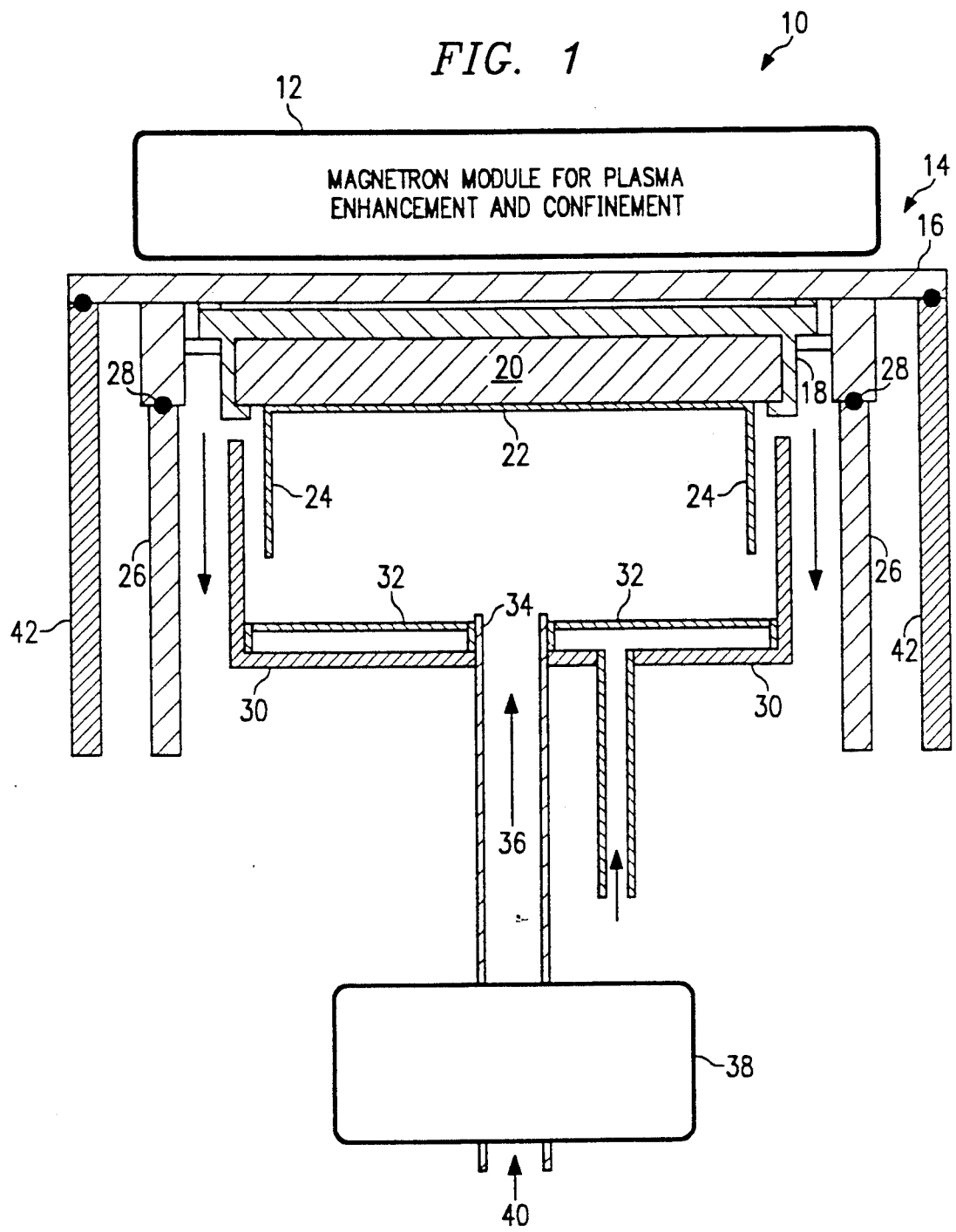
FIG. 1 is a partially broken-away schematic view of a single-wafer plasma processing system showing use and placement of the magnetron module of the present invention (face-down wafer processing)

FIG. 1 illustrates the schematic view of a single-wafer magnetron plasma processing system 10 along with the proper placement of the magnetron module of the present invention outside the vacuum environment over the process chamber 14. The plasma processing system 10 basically includes magnetron module 12 which mounts to process chamber 14. The vertical distance between the magnet assembly 12 and the process chamber 14 can be adjusted. Process chamber 14 comprises water-cooled stainless steel vacuum base plate 16 which engages quartz support module 18. Quartz support module 18 firmly holds multipurpose low thermal mass chuck 20 in place so that multipurpose chuck module 20 contacts semiconductor wafer 22. Three or four quartz wafer holding pins 24 clamp and support semiconductor wafer 22 and hold the wafer in good thermal and electrical contact with chuck 20. Process chamber wall 26 seals to vacuum plate 16 by way of process chamber vacuum seal 28. Anodized aluminum ground electrode 30 (made of a flat plate and a cylindrical segment) surrounds wafer pins 24 and contains a cylindrical section along with the quartz gas shower head 32. Sapphire or quartz tube 34 provides a path for microwave plasma stream 36 to enter process chamber via the hole in the ground electrode 34. Microwave cavity 38 generates a plasma gas discharge for the gas coming from gas inlet 40 and results in plasma stream 36. Auxiliary chamber wall 42 seals to vacuum base plate 16 and surrounds process chamber wall 26 by producing a vacuum shield. The vacuum shield space between the auxiliary chamber wall 42 and the process chamber collar 26 is connected to the load-lock chamber vacuum (not shown).

The total surface area of the anodized aluminum (or stainless steel) ground electrode (also called "counter electrode"), which consists of the cylindrical and flat shower head surface areas, is a factor in determining the self-induced DC bias during plasma processing; larger counter electrode surface areas result in larger self-induced DC bias and more energetic ions. The total diameter or surface area of the shower head 32 should be made at least as large as the wafer 22 or the multipurpose chuck 20. As a result, the height of the cylindrical section of the counter electrode may be adjusted to optimize the DC bias and ion energies during magnetron-plasma-enhanced processing.

Figure 2:
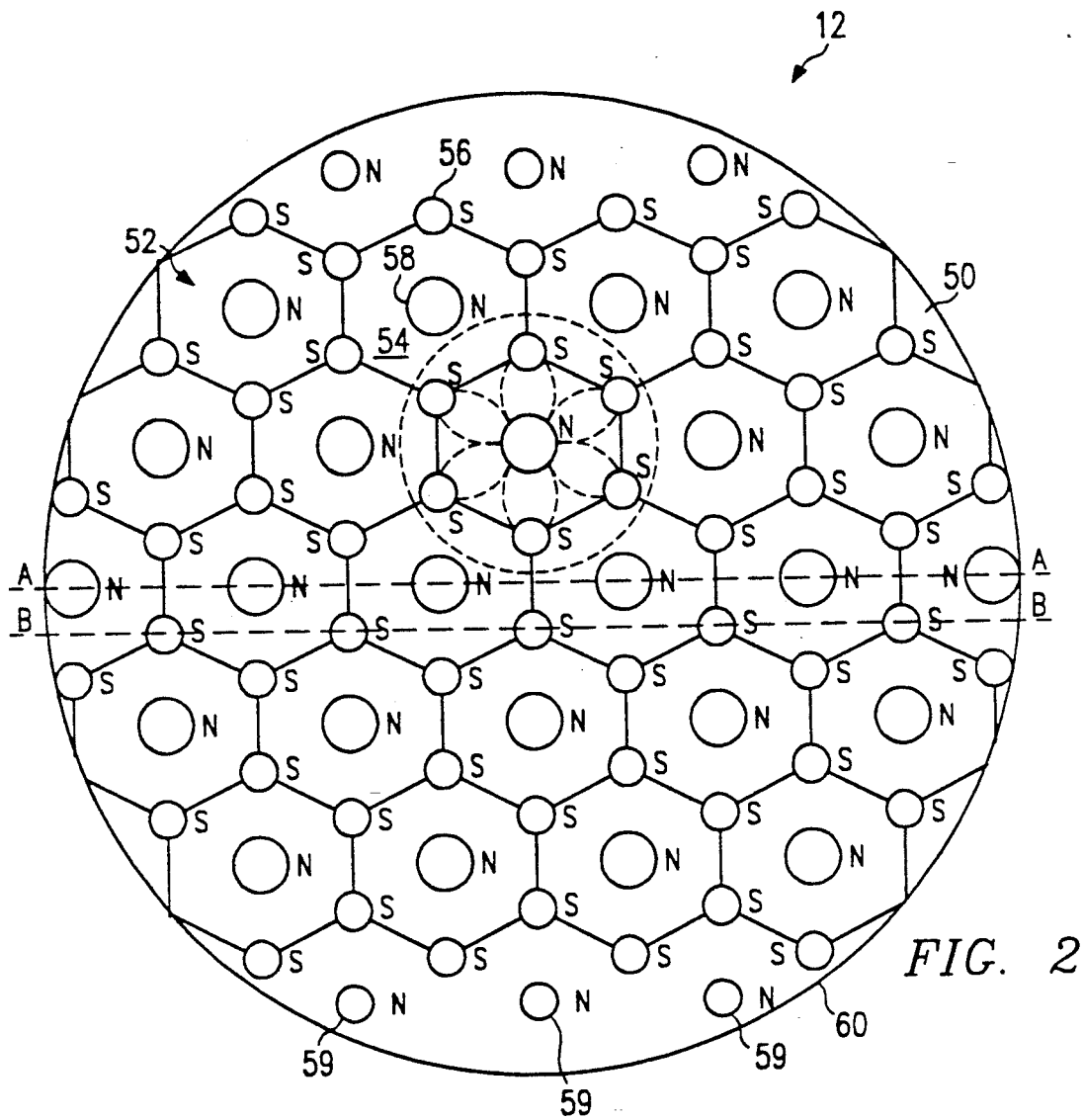
FIG. 2 shows a planar view of a preferred embodiment of the hexagonal-array magnetron module of the present invention.
Figure 3:
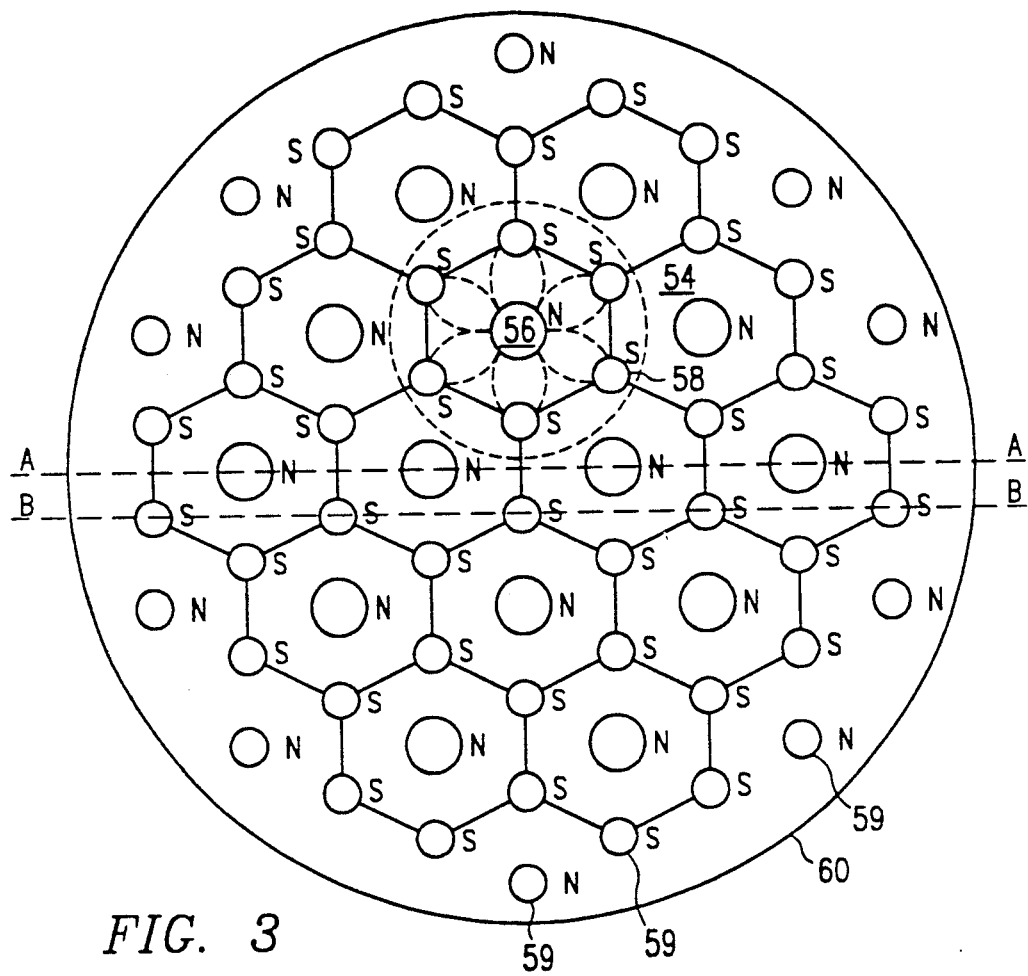
FIG. 3 provides a planar view of a preferred embodiment of the hexagonal-array magnetron module of the present invention with a different boundary arrangement and termination of the magnets at the periphery of the circular magnetic assembly.

FIGS. 2 and 3 show two planar views of a preferred embodiment of the hexagonal-array magnetron module 12 of the present invention. Magnetron module 12 includes soft magnetic material iron base plate 50 and magnetic array 52. Magnetic array 52 comprises a plurality of unit cells 54 (surrounded by the dash line) adjoining one another. Each of the unit cells 54 comprises outer unit cell magnets 56 and a central unit cell magnet 58. These appear throughout the array from the planar center on out to edge 60. Magnetron module 12 of the preferred embodiment comprises a magnetically conductive (e.g. iron) base plate 50 to which magnetic array 52 integrally mounts. In the preferred embodiment, iron is the material for base 50, however, other materials having similar magnetic conductivity and strength properties can be used. The lines connecting the adjacent magnets are only imaginary lines drawn to highlight the distributed array structure.

Hexagonal unit cells 54 are repeated to form a periodic pattern across magnet array 52 and comprise a plurality of cylindrical magnets 56 that produce a periodic magnetic field at the semiconductor wafer 22 face. In the preferred embodiment of the present invention, each unit cell 54 is of identical cell size and outer magnets 56 surround a central unit cell magnet 58 is a hexagonal pattern. Adjoining unit cells 54 share outer magnets 56 so that each outer magnet 56 contributes as a part of the hexagonal pattern for three neighboring unit cells 54 (except at the edge of the magnetron assembly). The magnetic array field comprises a sum of the smaller unit cell magnetic fields that are dispersed throughout the array, so there are no discrete major global sources for the magnetron magnetic field as with conventional magnetrons. The magnetic field of the magnet array possesses a two dimensional periodicity because the total magnetic field that the magnetron module produces is the sum of the fields of the smaller unit cells, and the smaller unit cells have dimensions which are small compared to the chuck or wafer diameter, but larger than the total chuck and base plate thickness ($>1''$).

The result of the repetitive unit cell 54 magnetic fields and the sharing of outer magnets 56 for each unit cell 54 is a periodic magnetic field across the entire magnet array 52. Additionally, unit cells 54 associate to permit expansion of magnet array 52 by further addition of unit cells that provide a uniform magnetic field. Thus, for any size fabrication chamber and wafer diameter, magnetic array 52 can be made any size necessary for the particular fabrication chamber. The unit cell dimensions (e.g. hexagonal side dimension) are determined by the distance between the free-standing magnet poles and the wafer (or total chuck and base plate thickness) and the transverse magnetic field strength required at the substrate surface. A typical intermagnet (unit cell radius) spacing is 20 mm to 50 mm.

The total number of unit cells in a magnetron assembly is determined by the unit cell radius and the size or diameter of the wafer chuck. The diameter of the magnetic assembly used in the magnetron module is chosen to be at least as large as the diameter of the wafer chuck (usually chosen to be somewhat larger). The preferred embodiment of this invention employs an 8'' to 10'' magnetron for 6'' wafer processing. The ideal forms of the distributed-array magnetron modules employ infinite number of unit cells over an infinite two-dimensional plane, resulting in a periodic magnetic field distribution. However, in practice, the distributed-array magnetron nodules have a finite size (e.g., diameter for circular modules) and, as a result, have a well-defined boundary which interrupts the two-dimensional periodic array. It is important to arrange the boundary magnets in the distributed-array magnetron modules such that the field discontinuity at the boundary does not propagate a non-periodic magnetic field into the magnetron plane. In both hexagonal-array designs shown in FIGS. 2 and 3, the boundary magnets have proper arrangement and size (cross-sectional area) in order to ensure field periodicity within the magnetron module. For instance, six of the boundary magnets 59 with north (N) free standing poles in FIG. 2 have smaller cross-sectional areas (by a factor of 2) compared to the magnets of similar polarity within the hexagonal-array module.

Magnet array 52 uses a periodic structure of the unit cells 54; however, the periodic structure must stop at certain points along the edge 60 of the magnetron. The field periodicity and distribution at the edge may not be particularly the same as the uniform field throughout an infinite magnetron. These non-uniformities could propagate into the center of the magnetron. In the preferred embodiment of the invention, magnet array 52 appears within magnetron module 12 so that the magnets form around edge 60 in a way that avoids global non-uniformities. This is achieved by properly positioning, with respect to edge 60, magnets 56 and 58 that appear in their proper half unit cell positions. Each of the magnets 59 at the boundary only interact with three nearest magnets, of opposite polarity and, as a result, have smaller cross-sectioned areas compared to the inner magnet, of similar polarity 58. By establishing these boundary conditions, no global magnetic field non-uniformities propagate to the center of the magnetron 12 from the edge 60. This will allow building a distributed-array finite size magnetron modules which behave similar to the infinite site arrays with identical unit cell configurations. The magnetron module of FIG. 3 shows a slightly different boundary magnet arrangement compared to that in FIG. 2.

Magnets 56 and 58 may be electromagnets or permanent magnets. The preferred embodiment employs permanent magnets. When the device uses permanent magnets, ceramic magnets, high-energy rare-earth magnets, or alnico magnets are preferable. Irrespective of the magnetic material, the resulting field from the magnets should be sufficiently strong to create a strong magnetron enhancement effect at the semiconductor device. One factor affecting the magnetic flux density is the height and cross-sectional area of the magnets. The discussion that follows later in this disclosure specifies the minimum necessary magnetic field strength for MPE processing. At this point, however, the reader should understand that the magnetic field strength of magnets 56 and 58 near the semiconductor water takes into consideration factors such as the chuck thickness, the necessary magnetic field strength for maximum plasma confinement and the pressure regime of the particular plasma process. Typical magnet heights are in the range of 1" to 8". The magnet cross-sectional areas should be small compared to the unit cell area.

Figure 4:
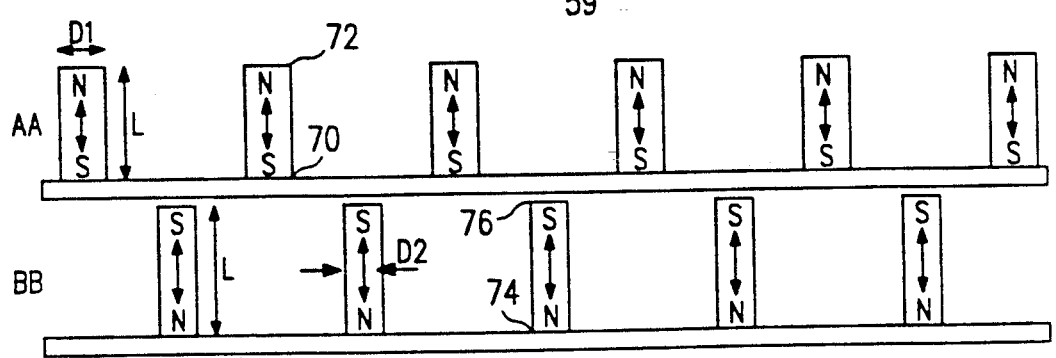
FIG. 4 shows a cross-sectional view of the preferred embodiment of the magnetron module shown in FIG. 2 (along the A—A and B—B axes)
Figure 5:
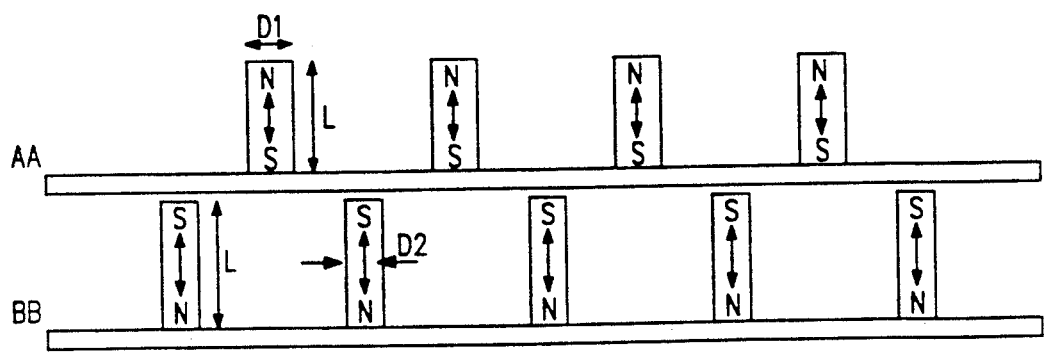
FIG. 5 shows a cross-sectional view of the preferred embodiment of the magnetron module shown in FIG. 3 (along the A—A and B—B axes)

FIGS. 4 and 5 show two cross-sectional side views of magnetron module 12 of FIGS. 2 and 3, respectively. Cross-section A—A shows the central unit cell magnets 58 with north polarity free-standing poles. Cross-section B—B shows some of the outer unit cell magnets with the opposite polarities (south). Each central unit cell magnet south pole 70 (magnets on hexagonal unit cell centers), in the preferred embodiment, mounts to the soft magnetic material base plate 50. With this design, the associated central unit cell magnet north pole 72 (magnet on hexagonal unit cell centers), forms the free standing pole racing the vacuum base plate 16 when magnetron module 12 mounts to process chamber 14. Likewise, each outer unit cell magnet north pole 74 (magnets on hexagonal unit cell peripheries) mounts to base 50. Similarly, with this design the associated outer unit cell magnet south pole 76 forms the opposite free standing pole facing the vacuum plate 16 when magnetron module 12 mounts to process chamber 14. The result of this configuration is a magnetic field distribution that has a transverse component parallel to the semiconductor wafer 22 face during MPE processing with the present invention. The transverse magnetic field strength is maximum between the magnets and is minimum over the magnet poles.

Design features that affect the localized magnetic field distribution and strength include the thickness of chuck 20. The greater the chuck 20 thickness, the greater the necessary magnetic field strength (and the unit cell radius) needed at the poles to penetrate the chuck and provide the necessary magnetron plasma enhancement at the semiconductor wafer 22 surface. Moreover, thicker chucks require distributed-array magnetron modules with larger magnets and larger unit cell dimensions, resulting in a smaller number of unit cells over the finite magnetron surface area. Therefore, for optimal use of the periodic magnetic field 62 that the present invention produces, a new low thermal mass RF chuck has been invented. This new multipurpose chuck 20 is hereinbelow described. Also, the new and novel chuck is disclosed and described in U.S. patent application Ser. No. 07/565,765, entitled "Multipurpose Low Thermal Mass Chuck for Semiconductor Processing Equipment", by Mr. Moslehi, filed concurrently with this application. The disclosure and claims of that U.S. patent application are hereby expressly incorporated by reference herein.

Figure 6:
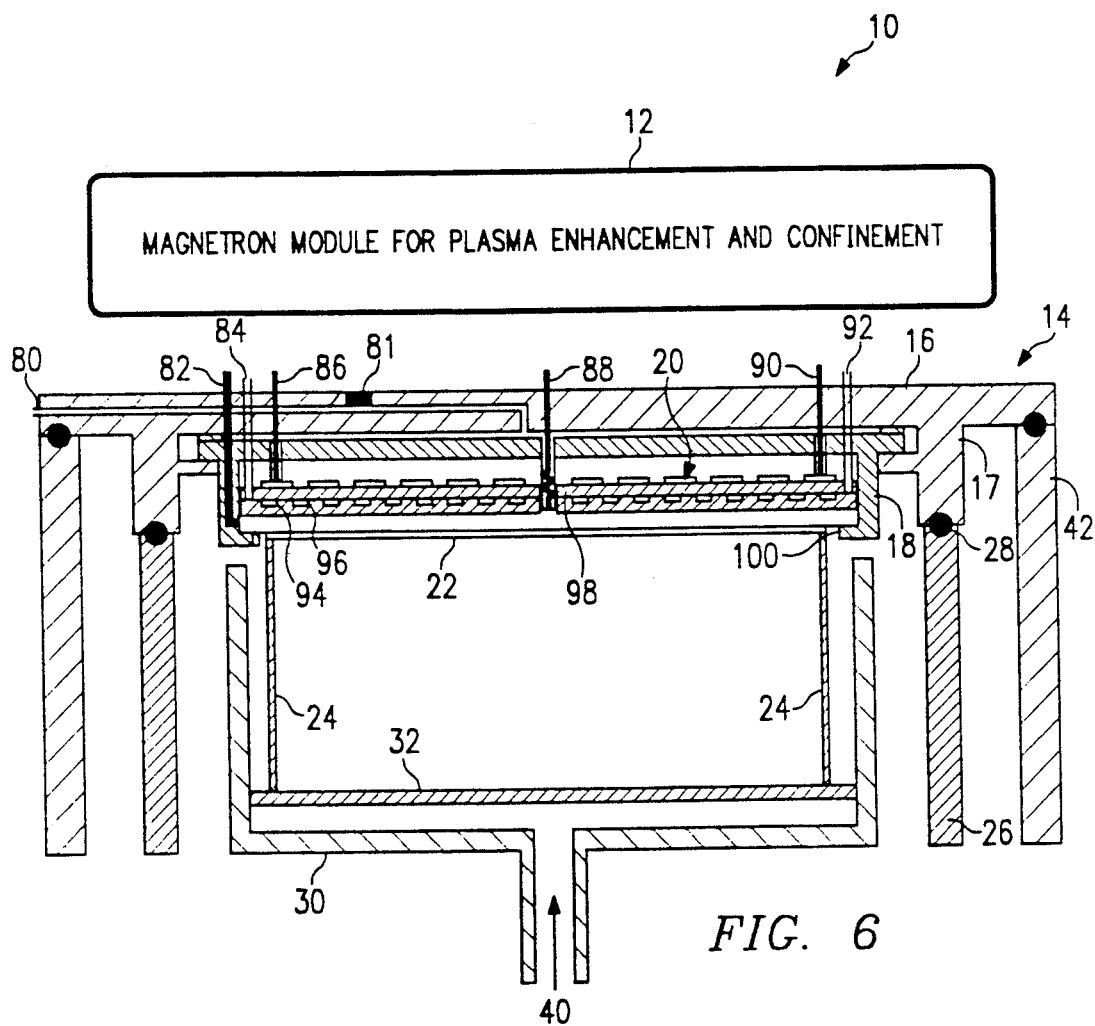
FIG. 6 shows a partially broken-away diagrammatic view of the multipurpose low-thermal-mass RF plasma chuck to be used with the magnetron module of the present invention.

FIG. 6 shows a partially broken away diagrammatic view of multipurpose chuck 20 and more particularly illustrates its connections from within chemical-vapor deposition (CVD) system 10. According to FIG. 6, magnetron module 12 mounts above stainless steel vacuum base plate 16 and multipurpose chuck 20 outside of process chamber 14. Stainless steel support vacuum base plate 16 engages quartz chuck ring 18. Beginning at the upper left portion of FIG. 6 beneath magnetron module 12, inert gas purge line 80 comprises a bore 81 through vacuum plate 16. RF contact 82 penetrates through vacuum plate 16 via an RF feed-through and connects to RF plate of multipurpose chuck 20. Coolant inlet 84 connects Heater wire 90 electrically connects (via an electrical feed-through) through vacuum plate 16 to chuck 20. Spring-loaded thermocouple 88 takes a temperature signal from chuck 20. Heater wire 90 taps from chuck 20 and exits through vacuum plate 16 (via another electrical feed-through). From the interior of chuck 20, coolant outlet 92 begins and continues through vacuum plate 16. Auxiliary chamber walls 42 seal to vacuum plate 16 and surround process chamber 14. Within auxiliary chamber walls 42, vacuum plate 16 seals to process chamber wall 26 at chamber vacuum seal 28. If necessary, all the chuck feed-throughs can be made at the center with proper thermal and electrical insulations. The coolant, heater, thermocouple, inert gas and RF power connections may all run from the center of the chuck via the center of the magnetron module. Moreover, as explained later, the chuck coolant block may employ multiple (two) inlets and multiple (two) outlets. The chuck coolant lines can be connected to grooves made in the vacuum base plate 16 in order to use the vacuum base plate 16 as a heat exchanger.

Basic elements of multipurpose chuck 20 include cooling module 94 which incorporates coolant tunnels 96. Heating element 98 is separated from the cooling module 94 by a thin thermally conducting electrically insulating boron nitride wafer (not shown) and makes electrical contact with heater wires 86 and 90. RF plate 100 integrally connects to a thermally conducting electrically insulating boron nitride wafer (not shown) at the bottom side of cooling module 94 opposite that of heating element 98 and connects to RF contact 82. Semiconductor wafer 22 is clamped against the RF plate 100 and quartz wafer holding pins 24 hold wafer 22 in place inside the plasma processing module. Anodized aluminum or stainless steel ground electrode 30 consisting of a flat plate and a cylindrical extension component surrounds wafer pins 24 and contains quartz or metallic gas shower head 32. Referring now to FIG. 6 as well as FIG. 1, gas shower head 32 provides one path for process gas injection. Sapphire or quartz tube 34 provides a second gas injection path for remote microwave (or RF induction) plasma stream 36 to enter process chamber via ground electrode 30. Microwave cavity 38 surrounds sapphire or quartz discharge tube 34 which receives gas from gas inlet 136 to generate plasma stream 36. Auxiliary chamber wall 42 seals to vacuum base plate 16 and surrounds process chamber wall 26. This arrangement provides an improved vacuum integrity for process chamber due to the fact that the space between process chamber collar 26 and auxiliary chamber 42 is pumped down. The vacuum shield between process chamber collar 26 and auxiliary chamber 42 is also connected to the load-lock chamber vacuum (not shown).

Figure 8:
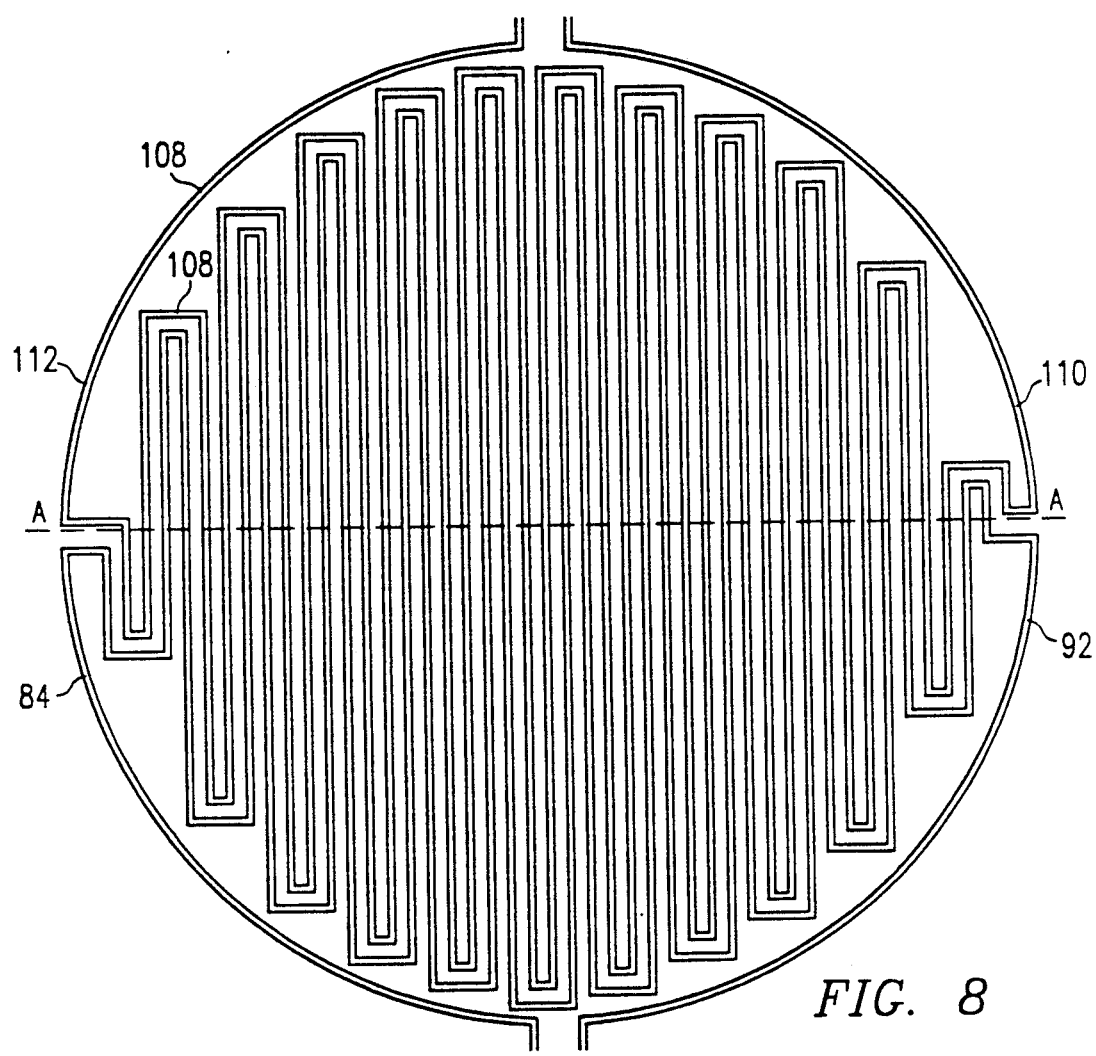
FIG. 8 provides a planar view of a preferred embodiment of the multipurpose chuck coolant module.
Figure 7:
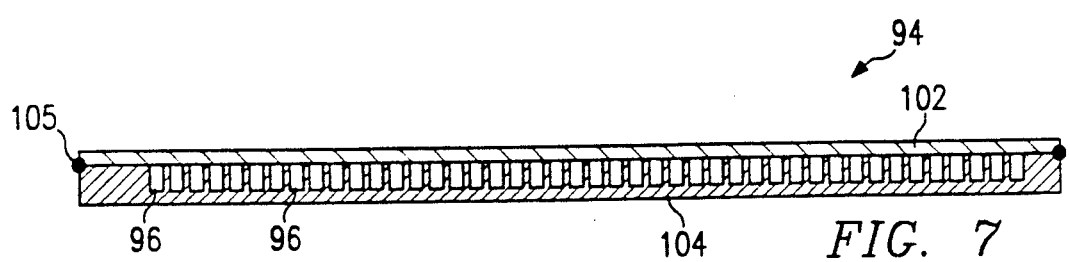
FIG. 7 is a cross-sectional view of a preferred embodiment of the multipurpose chuck coolant module.

FIGS. 7 and 8 more particularly show the construction of cooling module 94 within chuck 20. FIG. 7 is a cross-sectional schematic view of coolant module 94 showing it to comprise a top metal (such as aluminum or copper or nickel or molybdenum) plate 102 and a bottom metal plate 104 made of a similar material as the top plate. Bottom metal plate 104 mechanically seals to top metal plate 102 at welded joint 106 and contains coolant tunnels 96.

FIG. 8 provides a planar view of a suggested groove pattern in the bottom plate 104 that demonstrates the metal groove pattern 108 for coolant flow through coolant tunnels 96. In bottom plate 104 there are two separate sets of coolant tunnels 96. One set uses coolant inlet 84 and coolant outlet 92 (also shown in FIG. 6), another uses coolant inlet 110 and coolant outlet 112 (not shown in FIG. 6). The combination of these two coolant tunnels is expected to result in uniform, transient and steady-state wafer cooling using a gas cooling medium such as compressed air or helium or a liquid coolant. Various other coolant groove patterns may be used. The coolant module may be made of anodized aluminum (for a low-temperature chuck) or nickel-plated copper (for a high-temperature chuck). Other choices of coolant module materials include refractory metals such as nickel or molybdenum. If anodized aluminum is used in the cooling module 94, the chuck can be used over a temperature range of −150° C. to +500° C. On the other hand, nickel, molybdenum, or copper extend the upper temperature limit to beyond 850° C.

Figure 10:
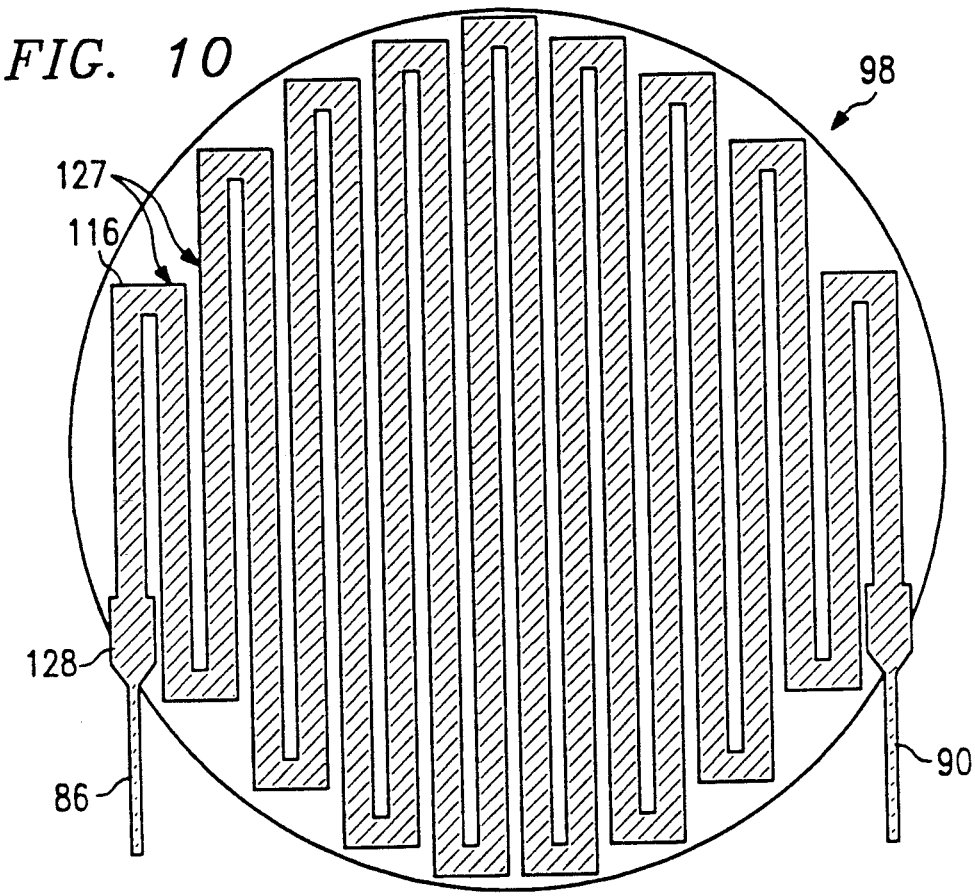
FIG. 10 shows a planar view of a preferred embodiment of the multipurpose chuck heating element.
Figure 9:
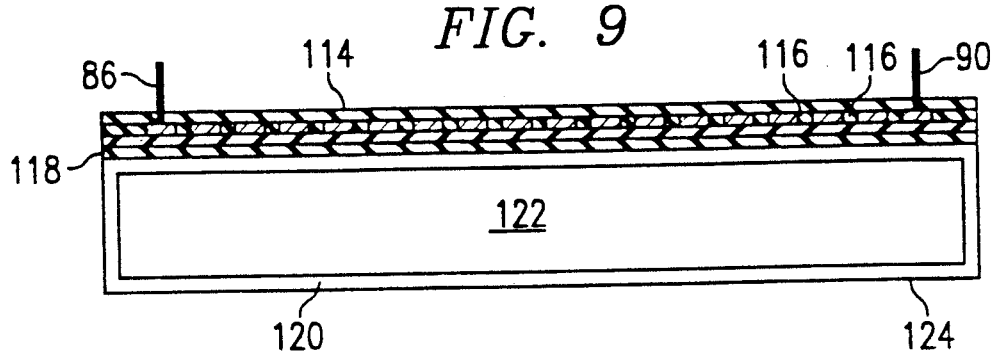
FIG. 9 is a cross-sectional view of a preferred embodiment of the multipurpose chuck heating element.

FIGS. 9 and 10 show the construction of heating element 98. FIG. 9 is a cross-sectional view of heating element 98 exhibiting top layer 114 of electrical insulation and passivation through which heater wires 86 and 90 contact resistor line 116. Bottom layer 118 of electrical insulation integrally joins top layer 114 and heater substrate wafer 122. Heater substrate wafer 122 comprises graphite wafer 120 which SiC-coating 124 surrounds. FIG. 10 shows a planar view of top layer 114 and displays the pattern that thin-film power resistor line 116 makes to form power heating resistor 127. Contact 128 provides electrical connection between heater wire 86 and resistor line 116. The heater substrate 122 may be also made of boron nitride or even quartz. Boron nitride is a good choice of heater substrate material because of its high thermal conductivity and electrical insulation.

FIG. 11 shows a planar view of the water cooling and chuck coolant groove pattern on the lower section of the stainless steel vacuum base plate 16. Grooves 130 cover vacuum plate 16 for both chuck coolant (air or helium) and base plate water cooling. Moving clockwise, at the left center side of FIG. 11, inlet 132 sends water coolant through support base plate 16 and to the wafer coolant outlet 134. Gas inlet 136 permits introduction of chuck coolant gas (compressed air or helium) through vacuum plate 16 and into the coolant block of the multipurpose chuck. Gas outlet 138 receives heated coolant gas from the cooling block of multipurpose chuck (gas outlet 138) via vacuum feed-through 140. Coolant outlet 134 receives coolant water from the vacuum base plate. Inert purge gas (helium) from multipurpose chuck 20 pass through support base plate 16 by passing through vacuum feed-through 152. Thermocouple connection tunnel 154 permits electrical connection to a thermocouple for sensing chuck 20 temperature via a feed-through 152. Coolant inlet 144 provides a second path for coolant water flow within the vacuum base metal plate 16. Gas inlet 146 is one of the two coolant gas inlets for heat removal from multipurpose chuck. Coolant gas release from the cooling block of the multipurpose chuck, gas outlet 148 provides a flow path. Coolant outlet 150 permits coolant water to pass through vacuum plate 16. Vacuum feed-through 156 receives heated coolant gas from cooling block and directs the gas via grooves in vacuum plate 16 to gas outlet 148. The water-cooled vacuum base plate also acts as a heat sink or a heat exchanger for the coolant gas channels connected to the cooling block of the chuck. At the planar center of vacuum plate 16 appears inert purge feed-through 152. Thermocouple feed-through 154 also appears at the vacuum plate 16 planar center and penetrates vacuum plate 16 and connects to thermocouple connection 154 with proper wire insulation. The vacuum base plate 16 is made of a lower section with grooves and a thin flat upper section. The two thin plates are brazed and/or welded together in order to contain the grooves within the bulk of the base plate 16. The RF connection feed-through can be placed at the center of the vacuum base plate 16 (not shown).

Multipurpose chuck 20 provides electrical contact between RF plate 100 and an RF power source (not shown) via RF contact 26, but at the same time passes the magnetic field distribution from magnetron module 12. Also, multipurpose chuck 20 provides for fairly rapid heating and cooling of semiconductor wafer 22. Therefore, the thickness and magnetic properties of RF chuck 20 can affect the magnetic field uniformity and field strength that the semiconductor wafer 22 sees within process chamber as well as the ultimate plasma density and process uniformity for the MPE process itself.

Multipurpose chuck 20 is designed as a low thermal mass chuck for maximum MPE processing throughput and uniformity. This occurs when the greatest amount of magnetic flux lines penetrate the chuck to affect plasma ion formation near the semiconductor wafer 22 face. Accordingly, the chuck of the present disclosure has a thickness of less than one-half that of most conventional plasma processing chucks. The total thickness of the chuck of this disclosure including the entire vacuum base plate can be as small as about 1".

Another design consideration for multipurpose chuck 20 is that it be able to rapidly heat and cool semiconductor wafer 22. For transferring thermal energy to the semiconductor wafer 22 and achieving uniform wafer heating, therefore, the chuck 20 thermal mass should be large compared to that of semiconductor wafer 22. However, for rapid wafer heating and cooling, or short thermal transients, the thermal mass should not be excessively large. Additionally, for maximum energy transfer from heating element 98 and heat extraction from the cooling module 94, respectively, chuck 20 employs two high thermal conductivity electrically insulating disks (boron nitride) to separate the heater from cooling block and the cooling block from RF plate 100.

Fully understanding how multipurpose chuck 20 achieves these design objectives is best understood by appreciating its fabrication. In particular, the fabrication methods for heating element 98 and RF plate 100 demonstrate how chuck 20 achieves the above design objectives. Fabricating heater element 98 of chuck 20 calls for the use of thin film technology on a substrate made of boron nitride, SiC-coated graphite or quartz wafer. The starting material for heater element 98, therefore, is a 1/16" thick, 7"-8" diameter substrate (for 6" wafer processing). To fabricate heating element 98, first deposit multiple layers of silicon oxide (1 $\mu$m $SiO_2$), then silicon nitride (1000 Å $Si_3N_4$), then silicon oxide (1 $\mu$m$iO_2$) on heater substrate by sputtering or CVD. This multilayer insulator acts as a buffer barrier and passivation layer (particularly on graphite or boron nitride). Then apply a layer of silicon (1000 Å Si) on these layers. Silicon layers act as an adhesion promoter. Sputter a 2.5 micron thick (or more) layer of tungsten (or other refractory metal) on the silicon layer, and then pattern the tungsten using either a lift-off or conventional patterning technique to produce power resistor 127. Deposit a thick layer of silicon oxide (1 Å $SiO_2$), silicon nitride (1000 Å $Si_4$), and silicon oxide (1 $\mu$m $SiO_2$) on the substrate as passivation overlayer. Then, open contact holes in this layer for electrical connecting heater wires 86 and 90 via contacts 94. Electrical connections may be made via electron beam welding or spring leading of wire, on contact region. Heater wires 86 and 90 will pass vertically through the contact holes in the quartz support module 18 and vacuum plate 16. The pattern shown in FIG. 10 indicates a one-zone heater.

An example of how to determine the necessary physical dimensions of the tungsten wires for the heater assembly is helpful for fabricating chuck 20. The resistivity, of tungsten wire at room temperature is 5 $\mu\Omega$cm. Assume, for example, that the wire thickness, t, equals 2 $\mu$m. Then, for a maximum $T_{max}=750°$ C., a wafer with an emissivity of 1.0 will emit about 7 watts/cm$^2$ from both surfaces. Furthermore, assume that the maximum blackbody radiation loss from one side approximately equals 4 W/cm$^2$. Therefore, design the heater block for a power rating of 5 W/cm$^2$. If we use a 7" circular RF plate in the chuck, its area is 248 cm$^2$. Thus, its maximum power dissipating, $P_{max}$, will be 1241 watts (=248 cm$^2 \times 5$ W/cm$^2$). Therefore, design the heater for a maximum power dissipation of at least 1250 watts. However, this is a lower limit of the maximum power required for steady-state heating at desired peak process temperature (e.g., 750°). Rapid heat-up transients usually require transient heating power levels several times larger than the steady-state power level (e.g., 3–5-$\times$larger power).

With this level of power dissipation, the next step is to calculate the necessary tungsten heater wire length for power resistor 127. Assume that there are n wires distributed uniformly in parallel on a 7" graphite wafer. Further, assume that the peak rms voltage across the tungsten wire equals 115 V. Then, for a $P_{max}$ value of 1250 watts, the maximum current, $I_{max}$, equals $1250/115 \approx 11$ A. For this current flow, the proper resistance, $R = V/I_{max} = 115$ V/11 A $\approx 10$ $\Omega$.

To reduce power per unit length, maximize the resistor wire length. Let the wire length, L, equal approximately 240 cm, then the unit power dissipation will be approximately 5.2 Watts/cm ($=P_{max}/L=1250$ W/240 cm.). For an arbitrary tungsten wire width, W, there are 240/W squares in the entire wire. For a resistance, R, of approximately 10 $\Omega$, $R=R_s*240/W=p/t(cm)*240/W(cm)$, so the total area of a wire cross-section, W*t (cm$^2$), equals $1.2\times10^{-4}$ cm$^2$)), which results in a current density well below the electro-migration limit of tungsten wire. As a result, the tungsten wire is an excellent material as power resistor 127 for the purposes of chuck 20. These considerations may facilitate the fabrication of heater element 98. Other refractory metals (such as titanium or molybdenum), and refractory metal nitrides and silicides may also be used as heater material. The heater may be designed in a multizone configuration for the best heating uniformity results. Typically 3 or 4 heating zones are required in order to optimize the transient and steady-state heating uniformity. Multi-zone resistive heaters can employ rings of resistive heaters with some cylindrical symmetry.

In a similar fashion, the following discussion may assist in fabricating RF plate 100 for chuck 20. RF plate connects to an RF source via RF contact 82 for a maximum RF power coupling of several hundred watts. To fabricate the RF plate with this capability, a preferred starting material for this portion of the device is a 7" conductive wafer made of SiC-coated graphite or a metal such as molybdenum with a thickness of 1 mm. An anodized aluminum plate may be used for a chuck with a maximum heating temperature of 200° C.

Having described the preferred embodiment of multipurpose chuck 20 of the present invention and magnetron 12, the following paragraphs describe their use together. It should be remembered, however, that chuck 18 of the present invention will operate without the use of new and novel magnetron 12. Magnetron 12, on the other hand, significantly improves the overall performance of the chuck 20 of the present invention.

Semiconductor wafer 22 sets face-down against the surface of chuck 20 during processing and magnetron module 12 mounts to the top of the stainless steel vacuum plate 16. This arrangement will produce a magnetic field that is distributed across and mostly parallel to the wafer 22 surface. Although this particular configuration illustrates magnetron module 12 in use with a single-wafer reactor for face-down wafer processing, the MPE processing configuration of magnetron 12 and chuck 20 is applicable to any format of wafer processing in a fabrication reactor (e.g., face-up, face-down, or vertical).

In the implementation of the present invention, the material layers (stainless steel vacuum plate, quartz, multipurpose RF chuck) that separate the wafer from magnetron module 12 are nonmagnetic and do not affect the magnetic field distribution on the wafer 22 surface. Also, if necessary, magnetron module 12 can be moved vertically away from the stainless steel vacuum plate and the wafer in order to reduce the magnetic field strength at wafer 22.

Due to the periodic nature of the magnetic field distribution, it is also possible to optimize process uniformity via small-scale scanning of the distributed-array magnetron modules over one or two dimensions. For instance, a time-averaged uniform and rotating transverse magnetic field may be obtained over the wafer surface by oscillating the magnetron module in the X and Y directions (within a plane parallel to the wafer or the magnetron base plate). The peak lateral scanning length along the x-axis and y-axis only needs to be equal to about one half the unit cell diagonal dimension (or equal to the unit cell radius). The X and Y scans can be done concurrently or sequentially during a plasma process. The X and Y scanning motions may also be combined with rotation (although either XY scan or rotation could be sufficient for optimum process uniformity.

As stated above, numerous factors determine the necessary magnetic field strength from magnets 56 and 58. The following discussion outlines these factors. During MPE processing, chuck 20 is connected to an RF power source. The RF power generates a plasma and a self-induced negative DC bias between the plasma and the semiconductor wafer 22 surface on the chuck. As a result of the transverse component of the magnetic field, electrons within the plasma follow the magnetic field lines that magnetron module 12 produces. Because of the perpendicular electric field and the transverse component of magnetic field, the magnetron condition is satisfied which results in enhanced plasma density and confined plasma near the wafer surface. The magnetron plasma discharge is produced by electron drift motion due to crossed electric and magnetic fields. The self-induced DC voltage generates an electric field perpendicular to the cathode or wafer surface. Moreover, the externally applied static magnetic field produces the necessary transverse magnetic field component parallel to the cathode. The electrons experience a cycloidal motion along a path that parallels the semiconductor wafer 22 face. Because of the cycloidal motion, the electron collision probability and plasma ionization efficiency increases. This tends to increase the plasma density and ion current density near the semiconductor wafer surface. The radius of the cycloidal path is known as the "Larmor radius". The Larmor radius, R, of an electron with an energy of V in a uniform transverse magnetic field can be calculated from the following relationship:

$$R = 33.7 \frac{V^{0.5}}{B} \text{ mm} \quad (1)$$

where B is the transverse magnetic flux density in Gauss and V is the electron energy in electron volts.

As indicated above, the Larmor radius is reduced with increasing the transverse magnetic flux density and/or decreasing the electron energy. The cyclotron frequency, f, in which the electron rotates is proportional to the transverse magnetic flux density and increases linearly as the transverse magnetic field strength increases according to the following equation:

$$f = 2.80 \times 10^{6} \cdot B \text{ (cycles/sec)} \quad (2)$$

Also, as the transverse magnetic field strength increases, the self-induced negative DC bias decreases, and this causes electron energies to decrease. Thus, as the transverse magnetic field strength increases, the frequency increases, the Larmor radius decreases, and the average ion energy imparted on the semiconductor wafer is reduced.

In plasma processing applications, the magnetron enhancement effects due to the interaction of the plasma species with the magnetic field become significant when the Larmor radius, R, becomes less than the electron mean-free path, $l_e$. This ensures that the electrons are sufficiently confined along the magnetic field lines to enhance the plasma density and ionization efficiency via ionizing collisions with gas molecules.

The electron mean-free path, $l_e$, is inversely proportional to the plasma gas pressure (P in Torr) according to the following equation:

$$l_e = \frac{a}{P} \quad (3)$$

where a is a constant (units of Torr-cm). The value of "a" is a function of the particular gas composition within the process chamber and can be considered the "mean-free path coefficient" of the gas within the chamber. Thus, as the pressure increases, the mean-free path will decrease.

In order to assure that the Larmor radius is less than the electron mean-free path the following equation, which combines equations (1) and (3), establishing a minimum of the required transverse magnetic flux density.

$$B = 3.37 \frac{PV^{0.5}}{a} \text{ Gauss} \quad (4)$$

Therefore, higher process pressures and higher electron energies will require stronger magnetic flux densities for enhanced MPE processing efficiency. For typical process pressures and electron energies the required magnetic flux density will be around 50-500 Gauss. Most magnetron-ion etching processes employ process pressures in the range of 1-20 mTorr for maximum etch anisotropy or zero undercut. However, the magnetron-plasma-assisted deposition processes may employ process pressures over a much wider range (e.g. up to several Torr).

Figure 12A:
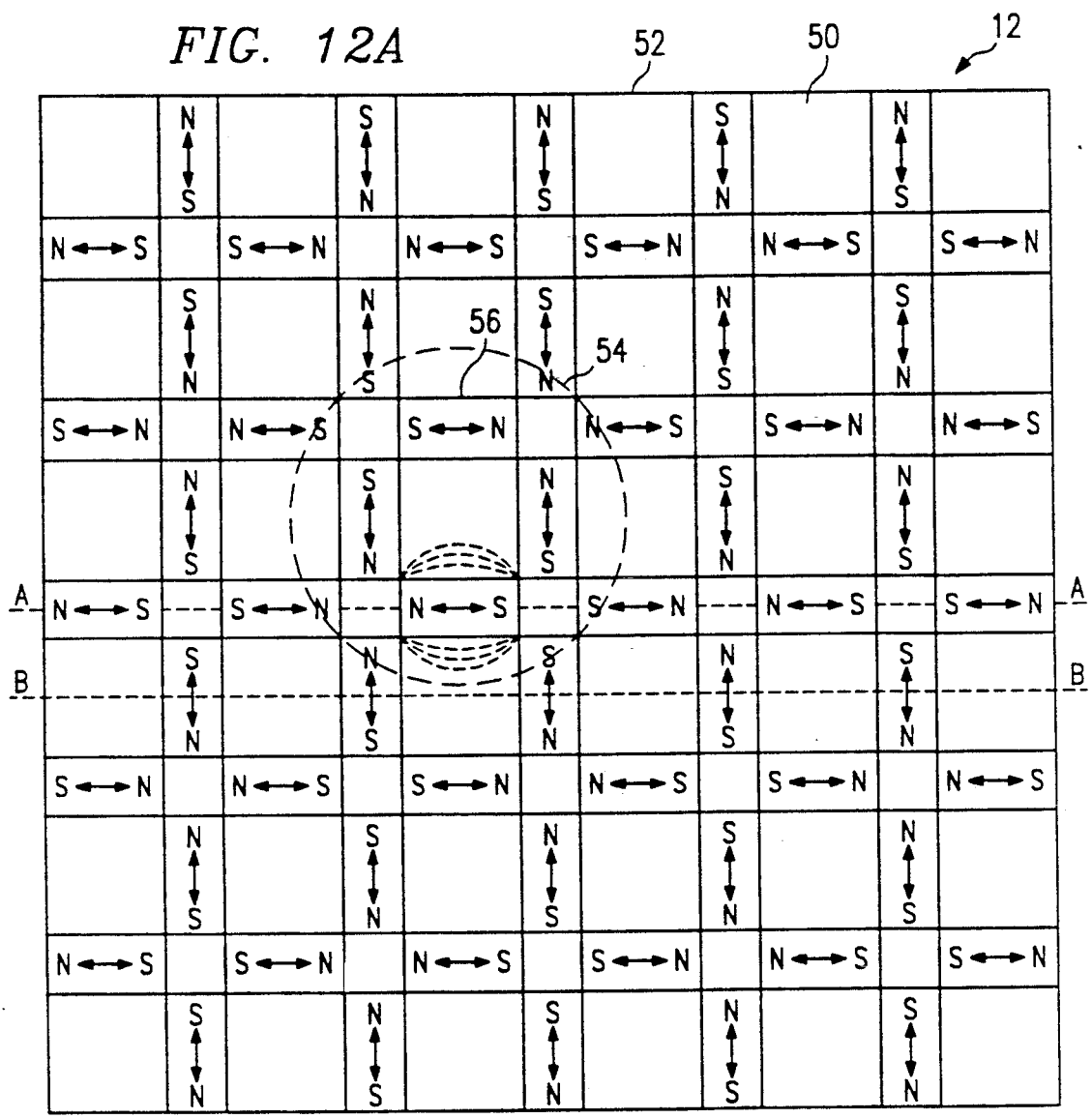
FIG. 12A shows a plan view of an alternative embodiment of the magnetron module of the present invention using a distributed grid magnetic array and FIGS. 12B and 12C show cross-sectional views.
Figure 12B:
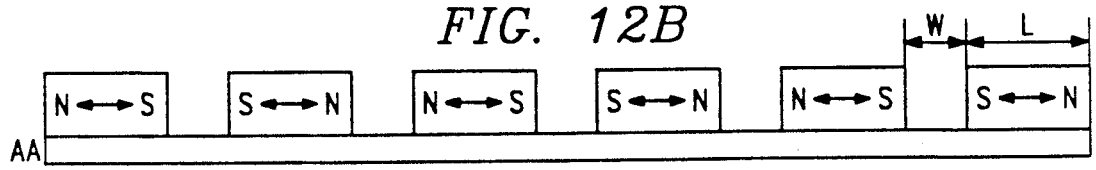
Figure 12C:
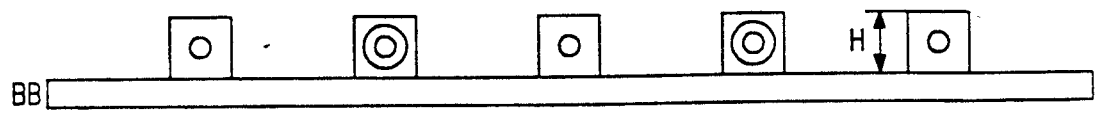

FIGS. 12 through 15 show alternative embodiments of magnetron module 12 within the scope of the present invention. FIG. 12 shows a distributed grid array or plane array. Reference numerals for the alternative embodiments of FIGS. 12 through 15 relate to their original use in FIGS. 2 and 3. In the grid-array design 52, unit cells 54 comprise magnets 56 which are oriented in a plane parallel to the plane of support base 50. In grid-array module 52, the magnetic field emanates from one end of the magnet, across the chuck and then to the other end of the magnet. An important characteristic of the distributed grid-array magnetron is that base 50 comprises a magnetically nonconductive material, such as non-magnetic stainless steel. This prevents shorting the magnetic field of each magnet 56. The grid-array design 52 may be more desirable in instances where an application calls for a more economical array than the hexagonal array. Compared to the simpler arrangements (for instance, only one pair of bar magnets), the distributed periodic magnet field from the grid-array module 52 still provides much better global field uniformity and, therefore, better magnetron plasma process uniformity. The magnetron module shown in FIG. 12 can also have a circular boundary.

Figure 13A:
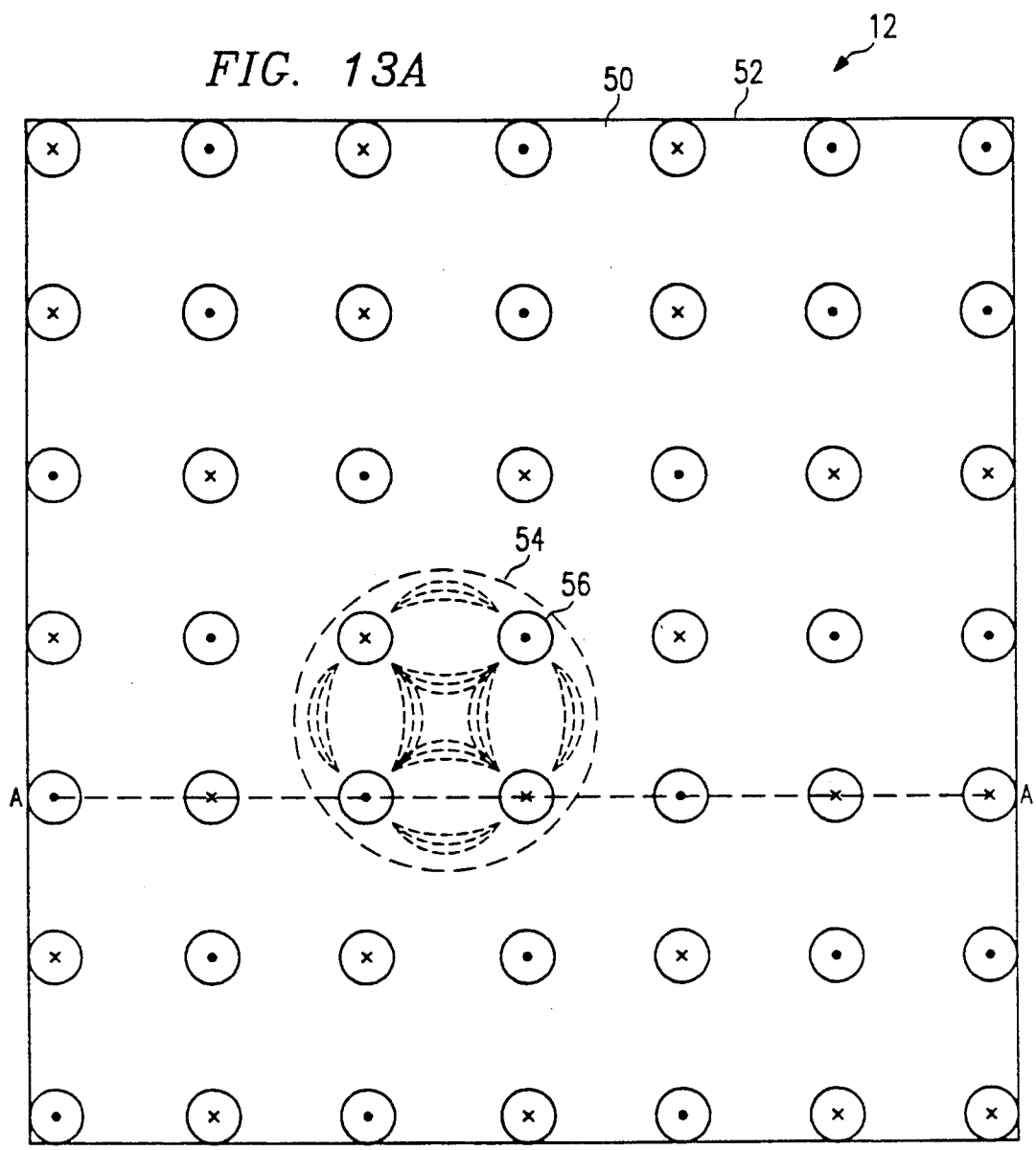
FIG. 13A is a plan view of an alternative embodiment of the magnetron module of the present invention using a distributed square magnetic array and FIG. 13B is a cross-sectional view.
Figure 13B:
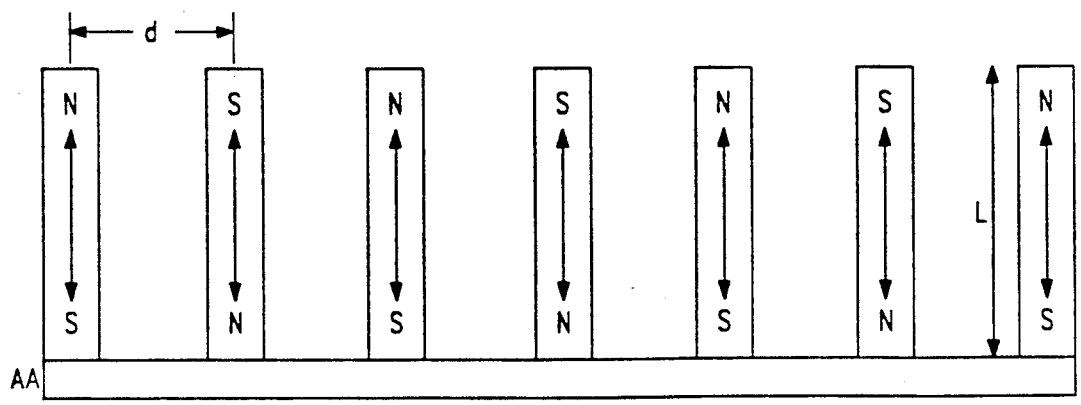

FIG. 13 shows a dot-matrix square magnet array 52 for magnetron module 12. Magnetron array 52 in this embodiment produces a magnetic field possessing periodic uniformity, but with a less efficient distributed field 60 than the hexagonal magnet array. As with each embodiment, the dot-matrix square magnet array 52 comprises unit cells 54. These unit cells 54 each comprise four single pole base magnets 56 in a square or rectangular pattern. In each unit cell 54, two of the magnets 56 north poles attach to base 50 and two of magnets 56 south poles attach to base 50. The base plate 50 is made of a soft magnetic material such as iron. This produces a periodic magnetic field across the magnet module 12 face. Each magnet in the array shares its field lines, with its four nearest neighbors of opposite polarity.

Figure 14A:
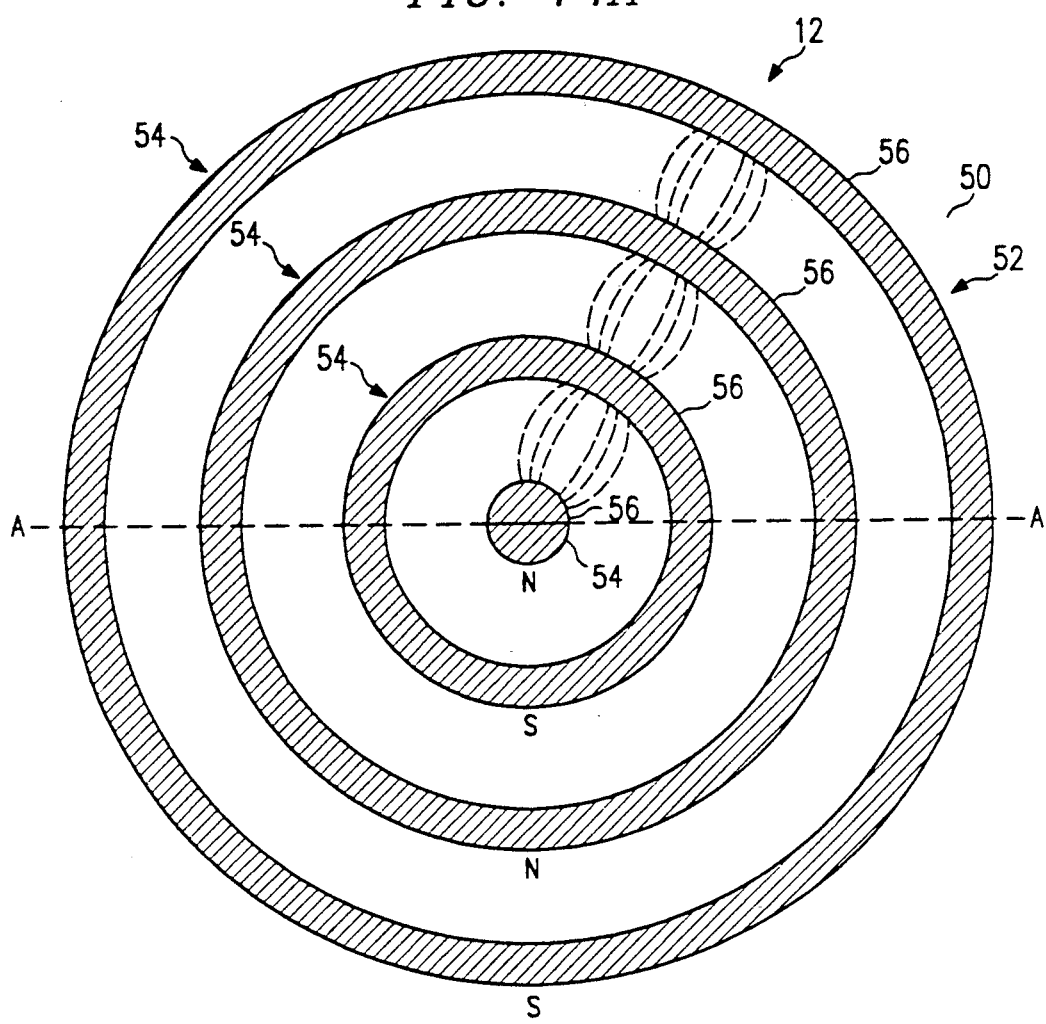
FIG. 14A shows a plan view of an alternative embodiment of the magnetron module of the present invention using a cylindrical concentric-ring magnetic array and FIG. 14B shows a cross-sectional view.
Figure 14B:
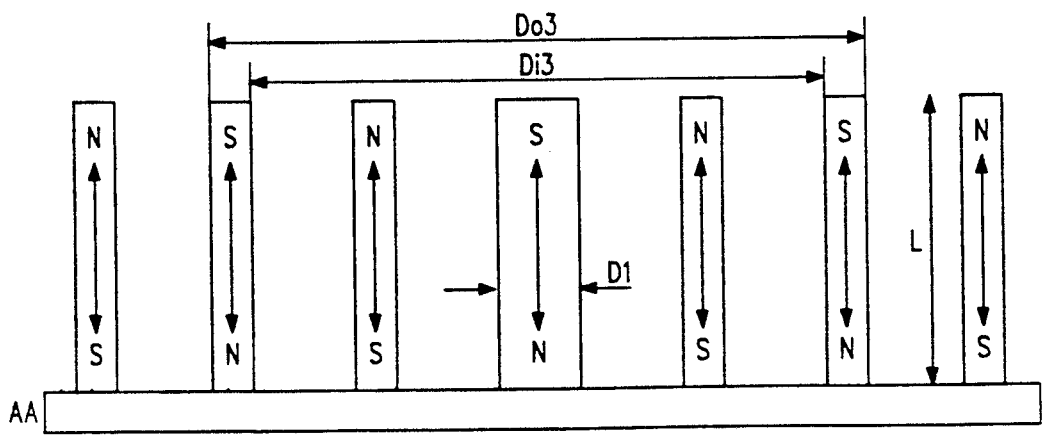

FIG. 14 shows a magnetron module 12 with a distributed concentric ring magnet array 52. While the concentric ring is not a distributed array in the sense that it does not have repetitive unit cells 54 dispersed throughout the two-dimensional plane, it provides a radially distributed magnetic field. In this configuration, unit cells 54 are, in fact, cylinders of increasing diameters. This is not the case in other configurations. The concentric circle magnet array 52 provides cylindrical and radial magnetic field uniformity, but at an increased cost. This is because of the increased expense of fabricating large ring magnets 56 that the concentric magnet array uses. In instances where there is the need for large scale cylindrical symmetry, however, the distributed concentric ring configuration of FIG. 14 may be desirable. The number of ring magnets and their spacing are determined based on the chuck size, field strength and other factors. The magnets of this module are mounted on an iron substrate.

Figure 15A:
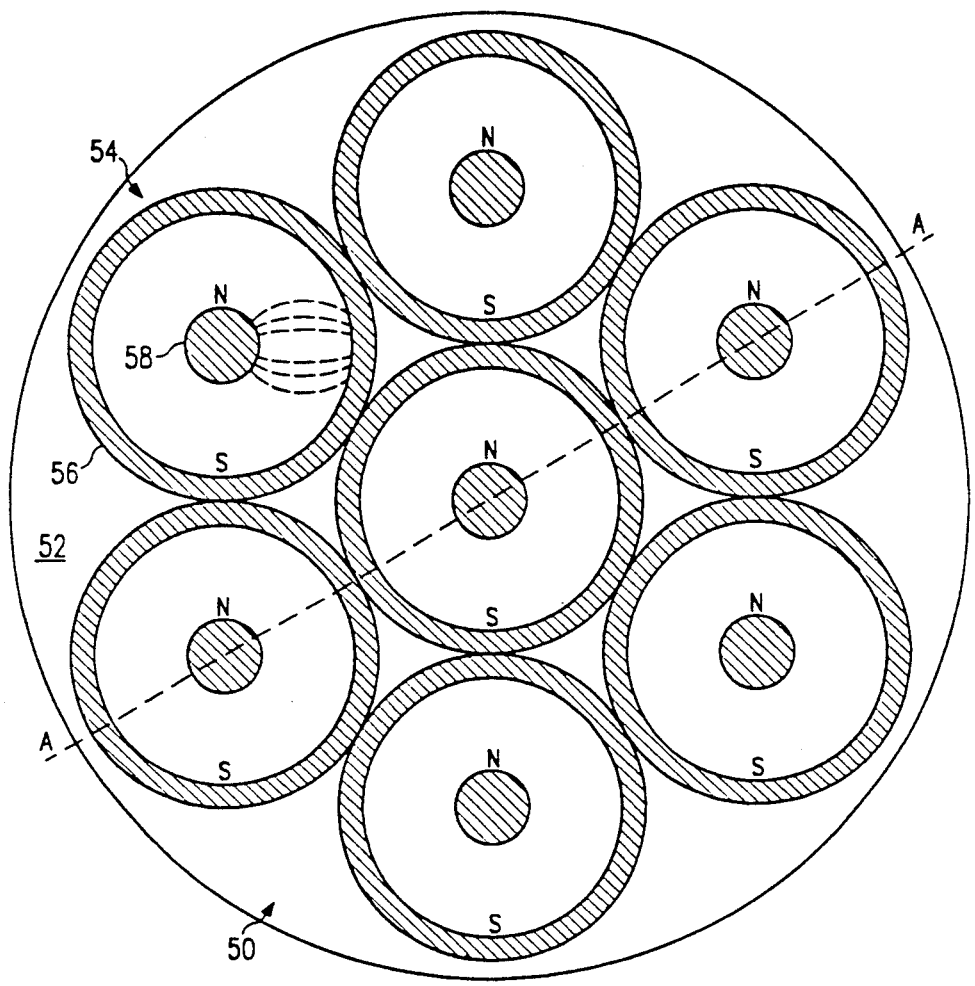
FIG. 15A is a plan view of an alternative embodiment of the magnetron module of the present invention using distributed cylindrical magnetic array with a combination of ring-shaped and cylindrical magnets and FIG. 15B is a cross-sectional view.
Figure 15B:
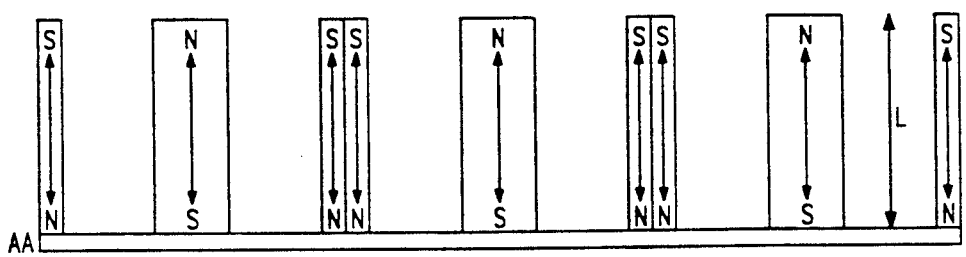

FIG. 15 is a uniformly distributed multipolar magnetron source with cylindrical magnets. This configuration combines the features of the preferred hexagonal configuration with those of the concentric ring configuration. All the magnets are mounted on a soft magnetic material (iron) substrate.

Figure 16:
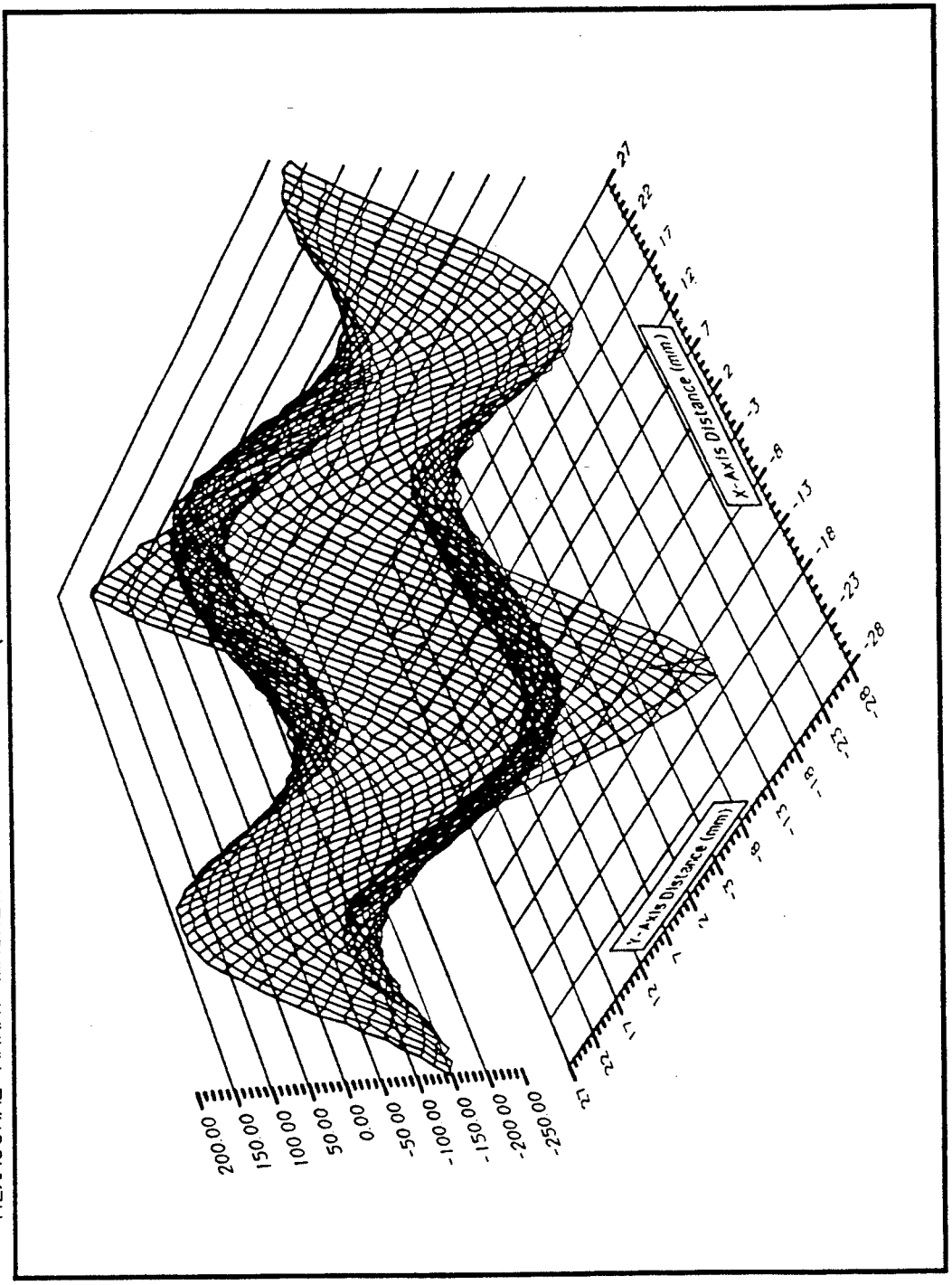
FIG. 16 provides a three-dimensional mesh plot of the magnetic flux density for a hexagonal-array magnetron module of the present invention (transverse "x" component of the magnetic field at a plane which is 10 mm away from the plane of magnet poles)

FIGS. 16 through 22 show results of the magnetic field measurements on the magnetron module of the present invention with a distribute-array magnetic flux density (hexagonal-array magnetron module). FIG. 16 plots the transverse "x" component at the magnetic flux density produced by the hexagonal-array module at a vertical distance of 10 mm below the magnetron module poles. The x- and y-axes vary from 27 mm to −28 mm and the three-dimensional mesh plot displays the magnetic field over a 55 mm×55 mm planar area of the larger magnetron assembly.

Figure 17:
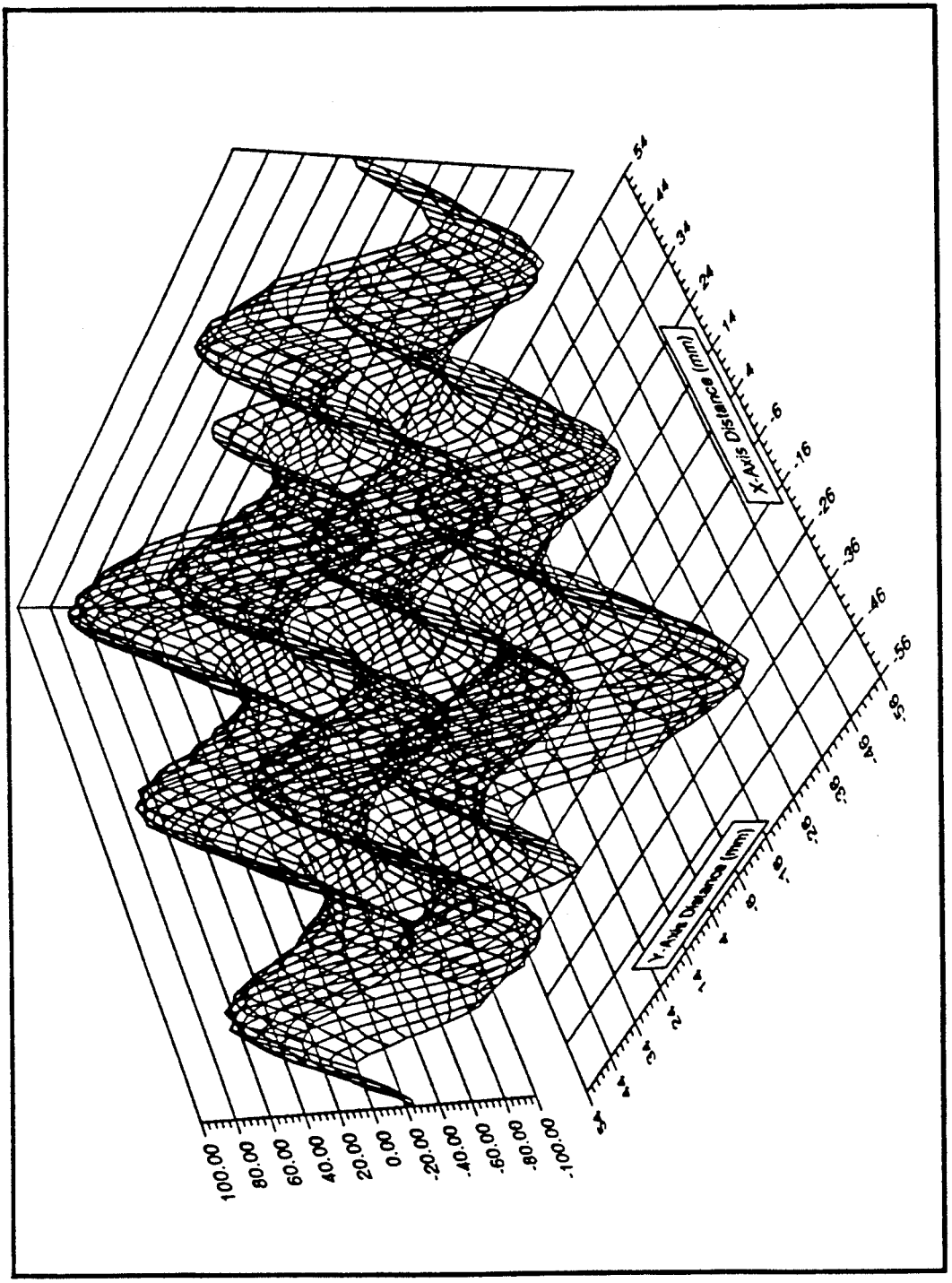
FIG. 17 shows a three-dimensional mesh plot of the magnetic flux density for a hexagonal-array magnetron module of the present invention (transverse "y" component of the magnetic field at a plane which is 15 mm away from the plane of magnet poles)

FIG. 17 shows a three-dimensional mesh plot of the transverse "y" component of the magnetic field distribution in a hexagonal-array magnetron module over a planar area of 110 mm×110 mm at a vertical distance of 15 mm from the magnet poles. The magnetic field map in this FIGURE demonstrates a repetitive transverse field over several unit cell areas. The transverse field components shown in FIG. 16 and FIG. 17 are for two perpendicular components (x direction and Y direction) of the magnetic field. Due to the overall symmetry of the hexagonal-array module along the x and y directions, the two maps in FIGS. 16 and 17 show fairly similar periodic distribution (although the flux density values are different because of the different distances from the poles). The center points (x,y)=(0,0) in these FIGUREs correspond to the center of the hexagonal-array magnetron module.

Figure 18:
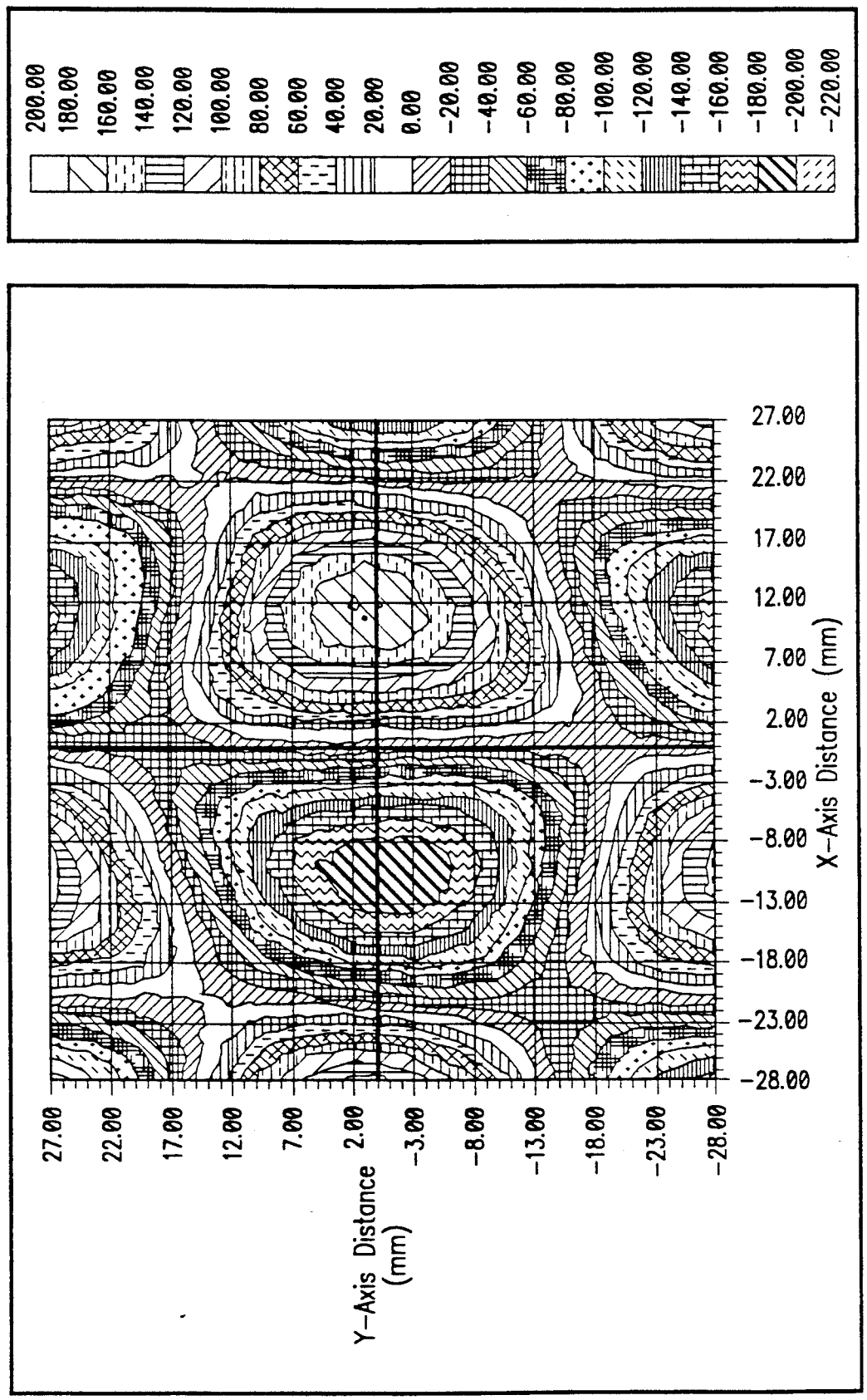
FIG. 18 is a contour plot of the magnetic flux density for a hexagonal-array magnetron module of the present invention (transverse "x" component of the magnetic field at a plane which is 10 mm away from the plant of magnet poles)

FIGS. 18 and 19 show two contour plots of the transverse "x" component of the magnetic field in a 55 mm ×55 mm planes at distances of 10 mm and 20 mm from the magnet poles, respectively (hexagonal-array magnetron module). It can be seen that the periodic magnetic flux density gets weaker at larger distances from the poles. The contour plots also show the periodicity of the magnetic field.

Figure 20:
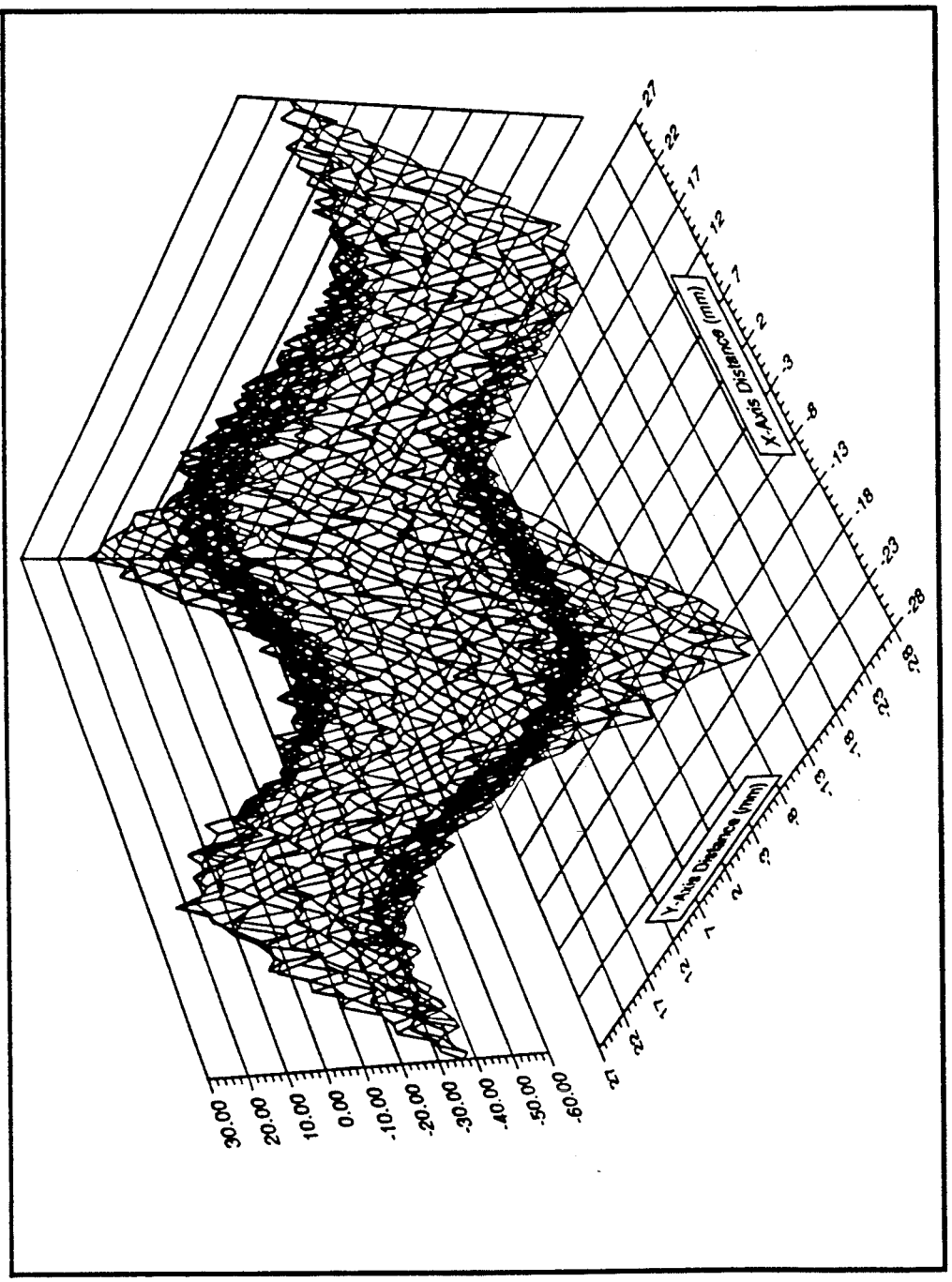
FIG. 20 provides a three-dimensional mesh plot of the magnetic flux density for a hexagonal-array magnetron module of the present invention (mesh plot for transverse "x" component of the magnetic field at a plane which is 20 mm away from the plane of magnet poles)

FIG. 20 illustrates the three-dimensional mesh plot of the same data shown in the contour plot of FIG. 19. Generally, the transverse field maxima correspond to the axial field minima.

FIGS. 21 and 22 show the contour plots of the transverse "y" components of the magnetic field in 55 mm ×55 mm planes at distances of 15 mm and 20 mm from the magnet poles, respectively. Larger vertical distances from the magnet poles result in weaker transverse flux density. A comparison of FIG. 19 with FIG. 22 shows a direct correlation between the transverse "x" and transverse "y" components of the magnetic field in the same measurement plane (55 mm×55 mm plane at 20 mm from the magnet poles). The net total transverse magnetic field at any point from the measurement plane is the vector sum of the "x" and "y" components (shown in FIGS. 19 and 22).

The field measurement data shown in FIGS. 16-22 were obtained on a hexagonal-array magnetron assembly similar to the one shown in FIGS. 2 and 4. The central magnets 58 in this module were 0.50" in diameter and 2" tall. The peripheral hexagonal unit cell magnets 56 were 0.35" in diameter and 2" tall. The unit cell radius (center-to-center magnet spacing) was 1.0. The magnetron iron base plate was 10" in diameter. The magnets were all made of ceramic material.

Stronger magnetron field can be achieved by scaling the magnet heights (larger than 2") and using rare-earth high-energy magnetic material. Thicker chucks (or larger wafer-to-magnetron spacings) will require magnetrons with larger unit cell radius. Larger unit cell radius and taller magnetic field and stronger flux density at the wafer surface.

Although the invention has been described with reference to the above specific embodiments, this description is not meant to be construed in a limiting sense. Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. A distributed-array magnetron-plasma processing module for plasma-assisted processing of a semiconductor wafer, comprising:
   a base mounted in parallel proximity to said wafer; and
   a magnetic array mounted to said base, said array comprising a plurality of unit cells formed in a repetitive pattern across said array, said unit cells comprising a plurality of uniformly spaced magnets associated to produce a distributed magnetic field at said wafer.

2. The magnetron of claim 1, wherein said base comprises a magnetically conductive material.

3. The magnetron of claim 1, wherein said unit cells adjoin one another to form a periodic magnetic field at the semiconductor wafer surface.

4. The magnetron of claim 1, wherein a plurality of said unit cells comprise magnets having alternating relative sizes.

5. The magnetron of claim 1, wherein the polarity of the magnets of said plurality of said unit cells alternates for producing a uniform magnetic field.

6. The magnetron of claim 1, wherein a plurality of said unit cells comprise magnets having a uniform height for producing a uniform magnetic field.

7. The magnetron of claim 1, wherein said array produces a cylindrically uniform magnetic field.

8. The magnetron of claim 1, wherein said array produces a radially uniform magnetic field.

9. The magnetron of claim 1, wherein said array further comprises a plurality of said unit cells each having a relatively similar size and magnetic flux distribution.

10. The magnetron of claim 1, wherein said unit cells associate to permit expansion of said array by further addition of a plurality of said unit cells while providing a globally uniform magnetic field.

11. The magnetron of claim 1, wherein said array comprises a plurality of unit cells comprising a hexagonal configuration of magnets.

12. The magnetron of claim 1, wherein said array comprises a plurality of unit cells comprising a dot-matrix configuration.

13. The magnetron of claim 1, wherein said array comprises a plurality of unit cells comprising a concentric circle configuration.

14. The magnetron of claim 1, wherein said array comprises a plurality of unit cells comprising a distributed cylindrical configuration.

15. The magnetron of claim 1, wherein said magnets comprise a permanent magnetic material.

16. The magnetron of claim 1, wherein said magnets comprise electromagnets.

17. The magnetron of claim 1, wherein said magnets comprise ceramic magnets.

18. The magnetron of claim 1, wherein said magnets comprise rare-earth magnets.

19. The magnetron of claim 1, wherein said magnets comprise alnico magnets.

20. A system for magnetron-plasma-enhanced processing of a semiconductor wafer, comprising:
a semiconductor wafer processing reactor; and
a semiconductor wafer plasma-assisted processing magnetron, said magnetron comprising:
a base connected to said reactor in parallel spaced relation to said semiconductor wafer; and
a magnetic array mounted to said base, said array comprising a plurality of unit cells formed in a repetitive pattern across said array, said unit cells comprising a plurality of magnets associated to produce a globally uniform magnetic field at the semiconductor wafer surface.

21. The system of claim 21, wherein said base comprises a magnetically conductive material.

22. The system of claim 20, wherein said unit cells adjoin one another to form a uniform magnetic field at the semiconductor wafer surface.

23. The system of claim 20, wherein a plurality of said unit cells comprise magnets having alternating relative sizes.

24. The system of claim 20, wherein the polarity of the magnets of said plurality of said unit cells alternates for producing a periodic magnetic field.

25. The system of claim 20, wherein said magnetic array further comprises a perimeter and a center, and wherein said plurality of said magnets are positioned on said perimeter an approximately equal distance from said center in order to provide a more uniform magnetic field.

26. The system of claim 20, wherein a plurality of said unit cells comprise magnets having a uniform height for producing a uniform magnetic field.

27. The system of claim 20, wherein said array produces a cylindrically uniform magnetic field.

28. The system of claim 20, wherein said array produces a radially uniform magnetic field.

29. The system of claim 20, wherein said array further comprises a plurality of said unit cells each having a relatively similar size and magnetic flux distribution.

30. The system of claim 20, wherein said unit cells associate to permit expansion of said array by further addition of a plurality of said unit cells while providing a uniform magnetic field.

31. The system of claim 20, wherein said array comprises a plurality of unit cells comprising a hexagonal configuration of magnets.

32. The system of claim 20, wherein said array comprises a plurality of unit cells comprising a rectangular configuration.

33. The system of claim 20, wherein said array comprises a plurality of unit cells comprising a concentric cylindrical configuration.

34. The system of claim 20, wherein said array comprises a plurality of unit cells comprising a distributed cylindrical configuration.

35. The system of claim 20, wherein said unit cells comprise a single magnet configuration.

36. The system of claim 20, wherein said magnets comprise a permanent magnetic material.

37. The system of claim 20, wherein said magnets comprise electromagnets.

38. The system of claim 20, wherein said magnets comprise ceramic magnets.

39. The system of claim 20, wherein said magnets comprise rare-earth magnets.

40. The system of claim 20 wherein said magnets comprise alnico magnets.

41. A method of magnetron-plasma enhanced processing of a semiconductor wafer, comprising the steps of:
associating a plurality of magnets to form a unit cell;
associating a plurality of said unit cells in a repetitive pattern to form a magnet array that produces a periodic magnetic field; and
directing said periodic magnetic field perpendicularly toward the surface of the wafer.

42. The method of claim 41, further comprising the step of associating said unit cells to adjoin one another to form a uniform magnetic field at the semiconductor surface.

43. The method of claim 41, further comprising the step of alternating the polarity of the magnets of said plurality of unit cells for producing a uniform magnetic field.

44. The method of claim 41, further comprising the step of associating said unit cells in a uniformly repetitive pattern across said magnet array to produce a cylindrically uniform magnetic field and process.

45. The method of claim 41, further comprising the step of associating said unit cells in a uniformly repetitive pattern across said magnet array to produce a radially uniform magnetic field and process.

46. The method of claim 41, further comprising the step of associating said unit cells in a uniformly repetitive pattern across said magnet array to permit expansion of said array by further addition of a plurality of said unit cells while providing a periodic magnetic field.

47. The method of claim 41, further comprising the step of associating said magnets of said unit cells to form a hexagonal configuration.

48. The method of claim 41, further comprising the step of associating said magnets within said unit cells to form a rectangular configuration.

49. The method of claim 41, further comprising the step of associating said magnets with said unit cells to form a concentric cylindrical configuration.

50. The method of claim 41, further comprising the step of associating said magnets within said unit cells to form a distributed cylindrical configuration.

51. The method of claim 41, further comprising the step of forming said magnets from a permanent magnetic material.

52. The method of claim 41, further comprising the step of forming said magnets from electromagnets.

53. The method of claim 37, further comprising the step of forming said magnets from ceramic magnets.

54. The method of claim 41 further comprising the step of forming said magnets from rare-earth magnets.

55. The method of claim 41 further comprising the step of forming said magnets from alnico magnets.

56. A magnetron for use with a semiconductor wafer fabrication process for increasing the ion density in the proximity of a surface of said semiconductor wafer, said magnetron comprising:
means for producing a plurality of individual magnetic fields repetitively and uniformly spaced apart; and
means for producing a circumferential boundary set of individual magnetic fields arranged uniformly around said plurality of individual magnetic fields to create a uniform magnetic boundary.

57. The magnetron as claim 56, wherein said magnetic fields comprise a plurality of poles in at least two parallel planes, and further comprising a magnetic conductive layer interposed between said planes.

58. The magnetron as claim 57, wherein said means for producing magnetic fields is operable to produce magnetic fields of each of said planes having opposite magnetic orientations with respect to said conductive layer.

59. The magnetron of claim 58, wherein said magnetic fields include a plurality of individual magnets having a parallelepiped shape and wherein the longitudinal axis of said magnets is perpendicular to said conductive layer and to said semiconductor.

60. The magnetron of claim 59, wherein said parallel planes are dispersed along said longitudinal axis of said magnets.

* * * * *